US012100671B2

(12) United States Patent
Yamaguchi et al.

(10) Patent No.: US 12,100,671 B2
(45) Date of Patent: Sep. 24, 2024

(54) SEMICONDUCTOR DEVICE

(71) Applicant: Murata Manufacturing Co., Ltd., Nagaokakyo (JP)

(72) Inventors: Yohei Yamaguchi, Nagaokakyo (JP); Tomoyuki Ashimine, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 337 days.

(21) Appl. No.: 17/645,617

(22) Filed: Dec. 22, 2021

(65) Prior Publication Data

US 2022/0115336 A1   Apr. 14, 2022

Related U.S. Application Data

(63) Continuation of application No. PCT/JP2020/030993, filed on Aug. 17, 2020.

(30) Foreign Application Priority Data

Aug. 21, 2019   (JP) ................... 2019-151479

(51) Int. Cl.
  *H01L 23/00*   (2006.01)
  *H01L 29/66*   (2006.01)
  *H01L 29/94*   (2006.01)

(52) U.S. Cl.
  CPC ...... *H01L 23/562* (2013.01); *H01L 29/66181* (2013.01); *H01L 29/945* (2013.01)

(58) Field of Classification Search
  None
  See application file for complete search history.

(56) References Cited

U.S. PATENT DOCUMENTS

| 7,432,170 B2 | 10/2008 | Ohbuko et al. |
| 10,411,087 B2 | 9/2019 | Nishiyama |
| 10,991,509 B2 | 4/2021 | Nakagawa et al. |

(Continued)

FOREIGN PATENT DOCUMENTS

| JP | 2005079513 A | 3/2005 |
| JP | 2005191182 A | 7/2005 |

(Continued)

OTHER PUBLICATIONS

International Search Report issued in PCT/JP2020/030993, dated Nov. 10, 2020.

(Continued)

*Primary Examiner* — Bo B Jang
(74) *Attorney, Agent, or Firm* — ArentFox Schiff LLP

(57) ABSTRACT

A semiconductor device that includes a semiconductor substrate having a first main face and a second main face opposite each other; a dielectric film on a part of the first main face, the dielectric film having an electrode layer disposing portion and a protective layer covering portion, and a thickness of the protective layer covering portion in an outer peripheral end of the dielectric film is smaller than a thickness of the electrode layer disposing portion of the dielectric film; a first electrode layer on the electrode layer disposing portion of the dielectric film; and a protective layer continuously covering a range from an end portion of the first electrode layer to the outer peripheral end of the dielectric film.

19 Claims, 8 Drawing Sheets

(56) References Cited

U.S. PATENT DOCUMENTS

| | | | |
|---|---|---|---|
| 11,688,557 B2* | 6/2023 | Higuchi | H01G 4/228 |
| | | | 257/532 |
| 2005/0082589 A1 | 4/2005 | Noda et al. | |
| 2005/0139956 A1 | 6/2005 | Ohbuko et al. | |
| 2008/0145996 A1 | 6/2008 | Nomura et al. | |
| 2015/0145104 A1* | 5/2015 | Bauer | H01L 21/283 |
| | | | 438/381 |
| 2018/0277622 A1 | 9/2018 | Nishiyama | |
| 2020/0066445 A1 | 2/2020 | Nakagawa et al. | |

FOREIGN PATENT DOCUMENTS

| | | |
|---|---|---|
| JP | 2008124405 A | 5/2008 |
| JP | 2008153497 A | 7/2008 |
| JP | 2019029537 A | 2/2019 |
| JP | 2019033154 A | 2/2019 |
| WO | 2017145515 A1 | 8/2017 |
| WO | 2019021817 A1 | 1/2021 |

OTHER PUBLICATIONS

Written Opinion of the International Search Report issued in PCT/JP2020/030993, dated Nov. 10, 2020.

* cited by examiner

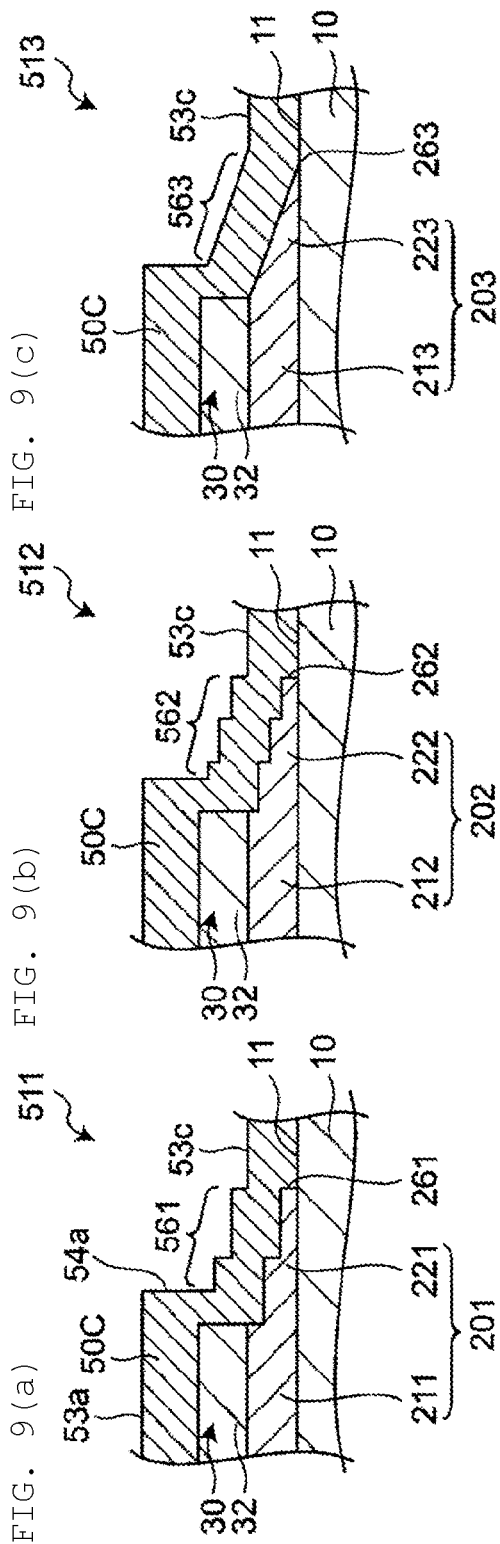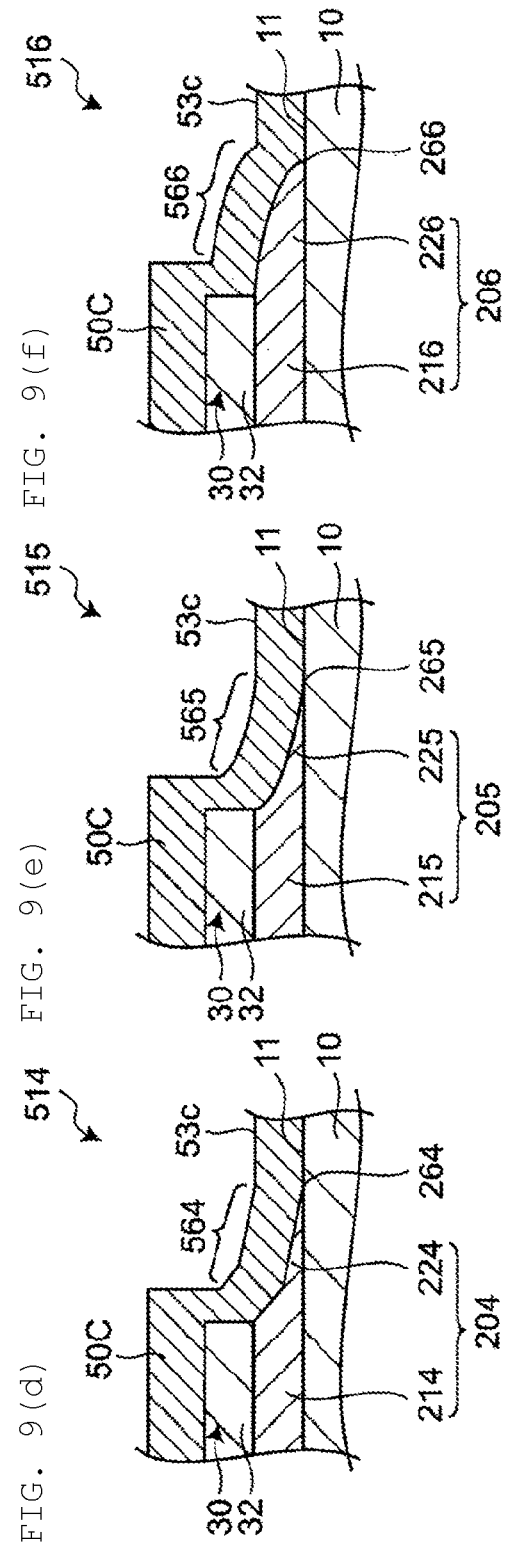

SEMICONDUCTOR DEVICE

CROSS REFERENCE TO RELATED APPLICATIONS

The present application is a continuation of International application No. PCT/JP2020/030993, filed Aug. 17, 2020, which claims priority to Japanese Patent Application No. 2019-151479, filed Aug. 21, 2019, the entire contents of each of which are incorporated herein by reference.

FIELD OF THE INVENTION

The present invention relates to a semiconductor device.

BACKGROUND OF THE INVENTION

Conventionally, as a capacitor structure in a semiconductor device, there is a capacitor structure described in Japanese Patent Application Laid-Open No. 2019-33154 (Patent Document 1). This capacitor structure is provided on an insulating film of a substrate. The capacitor structure includes a second electrode layer disposed on a part of the insulating film, an interlayer insulating film (dielectric film) covering the second electrode layer, a metal film disposed on a part of the interlayer insulating film, a first electrode layer disposed on the metal film, and a protective insulating film (protective layer) continuously covering a range from an end portion of the first electrode layer to the insulating film.
Patent Document 1: Japanese Patent Application Laid-Open No. 2019-33154

SUMMARY OF THE INVENTION

It has been found, however, that this semiconductor device has the following problems. In the semiconductor device, internal stress is generated in the protective layer by heat applied during the manufacturing, mounting, and use of the semiconductor device. More specifically, when the semiconductor device is heated or cooled, the protective layer may be thermally deformed by expansion or contraction. This thermal deformation is constrained by the member (for example, the semiconductor substrate) below the protective layer, so that internal stress is generated in the protective layer. As a result, a crack is likely to occur in the protective layer. In particular, when a crack occurs in the protective layer covering a portion around an end portion of the dielectric film, moisture may enter the dielectric film through the crack in the protective layer. On the other hand, in recent years, as opportunities for applying high voltage to the semiconductor device increase, there is an increasing demand for high withstand voltage properties. Under such high voltage, when the moisture enters the dielectric film through the crack in the protective layer, there is a problem that dielectric breakdown strength of the dielectric film is reduced.

Therefore, an object of the present disclosure is to provide a semiconductor device that suppresses the occurrence of a crack in a protective layer covering a portion around an end portion of a dielectric film and suppresses reduction in dielectric breakdown strength of the dielectric film (deterioration in voltage withstand properties of the dielectric film) due to the occurrence of the crack.

The present inventors have conducted intensive studies in order to solve the above problems, and have found that when a thickness at an outer peripheral end of the end portion (protective layer covering portion) of the dielectric film is reduced as compared with a thickness of the dielectric film other than the end portion, the occurrence of a crack is suppressed in the protective layer covering the portion around the end portion of the dielectric film. In this way, the present inventors have found technical significance of reducing the thickness at the outer peripheral end of the end portion of the dielectric film, and have completed the present disclosure. That is, the present disclosure includes the following aspects.

In order to solve the above problems, a semiconductor device according to an aspect of the present disclosure includes a semiconductor substrate having a first main face and a second main face opposite each other; a dielectric film on a part of the first main face, the dielectric film having an electrode layer disposing portion and a protective layer covering portion, and a thickness of the protective layer covering portion in an outer peripheral end of the dielectric film is smaller than a thickness of the electrode layer disposing portion of the dielectric film; a first electrode layer on the electrode layer disposing portion of the dielectric film; and a protective layer continuously covering a range from an end portion of the first electrode layer to the outer peripheral end of the dielectric film.

According to the above aspect, a thickness at the outer peripheral end of the protective layer covering portion of the dielectric film is smaller than a thickness of the electrode layer disposing portion of the dielectric film. In this way, since the dielectric film has, as the protective layer covering portion thereof, a thin film region having a relatively small thickness at least at the outer peripheral end, a step of a step portion of the protective layer around an end portion (protective layer covering portion) of the dielectric film can be made small. When the step of the step portion is made small, the distortion of the protective layer is reduced, and internal stress generated in the protective layer around the protective layer covering portion of the dielectric film can be reduced. As a result, the occurrence of a crack can be suppressed in the protective layer around the end portion of the dielectric film. Therefore, in the above aspect, moisture can be prevented from entering the dielectric film through the crack, and deterioration in withstand voltage (reduction in dielectric breakdown strength) of the dielectric film can be suppressed.

In addition, in an aspect of the semiconductor device, a minimum thickness of the electrode layer disposing portion is larger than a maximum thickness of the protective layer covering portion.

According to the above aspect, a minimum thickness of the electrode layer disposing portion is larger than a maximum thickness of the protective layer covering portion. Therefore, the dielectric film can have, as the protective layer covering portion thereof, a thin film region having a relatively small thickness over the whole protective layer covering portion. Therefore, in the above aspect, moisture can be prevented from entering the dielectric film through a crack, and deterioration in withstand voltage of the dielectric film can be further suppressed.

In addition, in an aspect of the semiconductor device, a thickness of the protective layer is equal to or larger than the thickness of the electrode layer disposing portion of the dielectric film.

According to the above aspect, a thickness of the protective layer is equal to or larger than the thickness of the electrode layer disposing portion of the dielectric film. In such a case, a ratio of the step of the step portion around the protective layer covering portion of the dielectric film to the thickness of the protective layer can be reduced. Therefore, the distortion of the protective layer is further reduced, and internal stress generated in the protective layer around the protective layer covering portion of the dielectric film can be further reduced. As a result, the occurrence of a crack is further suppressed. In addition, since the thickness of the protective layer becomes large, a creepage distance of the protective layer increases. Thus, the occurrence of creeping discharge between an exposing portion of the first electrode layer (or an external connection electrode) and an exposing portion of the semiconductor substrate (first main face) can be suppressed.

In addition, according to an aspect of the semiconductor device, the end portion of the first electrode layer has a first end portion having an outer peripheral end and a second end portion adjacent to the first end portion and extending toward a center of the first electrode layer, and a thickness at the outer peripheral end of the first end portion is smaller than a thickness of the second end portion.

According to the above aspect, a thickness at the outer peripheral end of the first end portion is smaller than a thickness of the second end portion. In this way, since the first electrode layer has, as the first end portion thereof, a thin film region having a relatively small thickness at least at the outer peripheral end, a step of a step portion of the protective layer around the first end portion of the first electrode layer can be made small. When the step of the step portion is made small, internal stress generated in the protective layer around the first end portion of the first electrode layer can be further reduced. As a result, the occurrence of a crack can be suppressed around a corner portion of the step portion of the protective layer around the first end portion of the first electrode layer. In this way, it is possible to suppress the occurrence of the crack around the corner portion of the step portion of the protective layer around the first end portion of the first electrode layer that is a portion different from a portion around a corner portion of the step portion of the protective layer around the protective layer covering portion of the dielectric film. Therefore, in the above aspect, moisture can be further prevented from entering the dielectric film through the crack in the protective layer, and reduction in dielectric breakdown strength of the dielectric film can be further suppressed.

In addition, according to an aspect of the semiconductor device, the thickness of the protective layer is 0.1 µm to 3 µm.

According to the above aspect, the entry of moisture from an outside of the semiconductor device into the dielectric film can be prevented, and the occurrence of the creeping discharge between the exposing portion of the first electrode layer (or the external connection electrode) and the exposing portion of the semiconductor substrate (first main face) can be suppressed.

In addition, according to an aspect of the semiconductor device, the first electrode layer is made of polysilicon or Al.

According to the above aspect, conductivity of the first electrode layer can be enhanced. In addition, according to the above aspect, since the first electrode layer has moisture resistance, the first electrode layer prevents moisture from entering the dielectric film through the first electrode layer. Thus, in the above aspect, reduction in dielectric breakdown strength of the dielectric film can be suppressed.

In addition, in an aspect of the semiconductor device, the protective layer is made of silicon nitride.

According to the above aspect, moisture resistance of the protective layer can be enhanced.

In addition, according to an aspect of the semiconductor device, the dielectric film is made of silicon oxide.

According to the above aspect, electric capacitance of the semiconductor device can be increased.

In addition, in an aspect of the semiconductor device, the semiconductor substrate has a trench on the first main face thereof, the electrode layer disposing portion of the dielectric film is continuously disposed on the first main face so as to cover an inner face of the trench to form a recess portion, and the first electrode layer has an entering portion entering the recess portion.

According to the above aspect, since the semiconductor device has a so-called trench structure, an area of an interface between the dielectric film and the first electrode layer increases, and as a result, the electric capacitance of the semiconductor device can be increased.

In addition, in an aspect of the semiconductor device, a thickness of the protective layer covering portion of the dielectric film decreases toward the outer peripheral end of the dielectric film.

According to the above aspect, a thickness of the protective layer covering portion of the dielectric film decreases toward the outer peripheral end of the dielectric film. Therefore, the protective layer covering portion of the dielectric film has, for example, a shape in which the step becomes small along the above direction or a shape having no step. Since the protective layer is formed along the shape of the lower layer, the protective layer has the shape in which the step becomes small or the shape having no step around the protective layer covering portion of the dielectric film. In this way, since internal stress generated in the protective layer around the protective layer covering portion of the dielectric film can be further reduced, the occurrence of a crack is further suppressed, and reduction in dielectric breakdown strength of the dielectric film is further suppressed.

In addition, in an aspect of the semiconductor device, a length in a width direction of the protective layer covering portion is larger than the thickness of the protective layer covering portion.

According to the above aspect, a length in a width direction of the protective layer covering portion is larger than the thickness of the protective layer covering portion. Therefore, for example, the corner portion of the step portion of the protective layer can be disposed away from the electrode layer disposing portion of the dielectric film. In such a case, if a crack occurs in the corner portion of the step portion of the protective layer, moisture hardly reaches the electrode layer disposing portion of the dielectric film through the crack. Therefore, reduction in dielectric breakdown strength of the dielectric film is further suppressed.

According to the semiconductor device according to an aspect of the present disclosure, the occurrence of a crack can be suppressed in the protective layer covering the portion around the end portion of the dielectric film, and reduction in dielectric breakdown strength of the dielectric film due to the occurrence of the crack can be suppressed.

BRIEF EXPLANATION OF THE DRAWINGS

FIGS. 9(a) to 9(f) are sectional views illustrating a fourth embodiment of a semiconductor device.

DETAILED DESCRIPTION OF THE INVENTION

Hereinafter, a semiconductor device according to an aspect of the present disclosure will be described in detail with reference to illustrated embodiments. Note that the drawings include some schematic drawings, and may not reflect actual dimensions and ratios. In addition, dimensions (more specifically, thickness, length, width, and the like) of components in the semiconductor device were measured on the basis of an SEM image taken with a scanning electron microscope.

First Embodiment

[Configuration]

Figure 1:
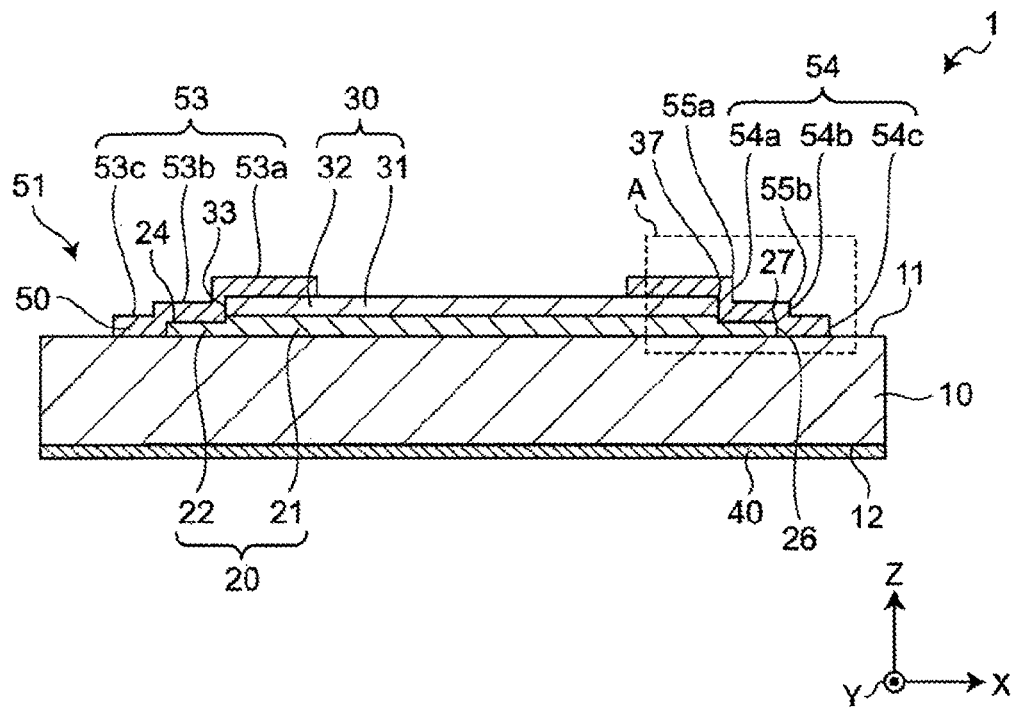
FIG. 1 is a sectional view illustrating a first embodiment of a semiconductor device.
Figure 2:
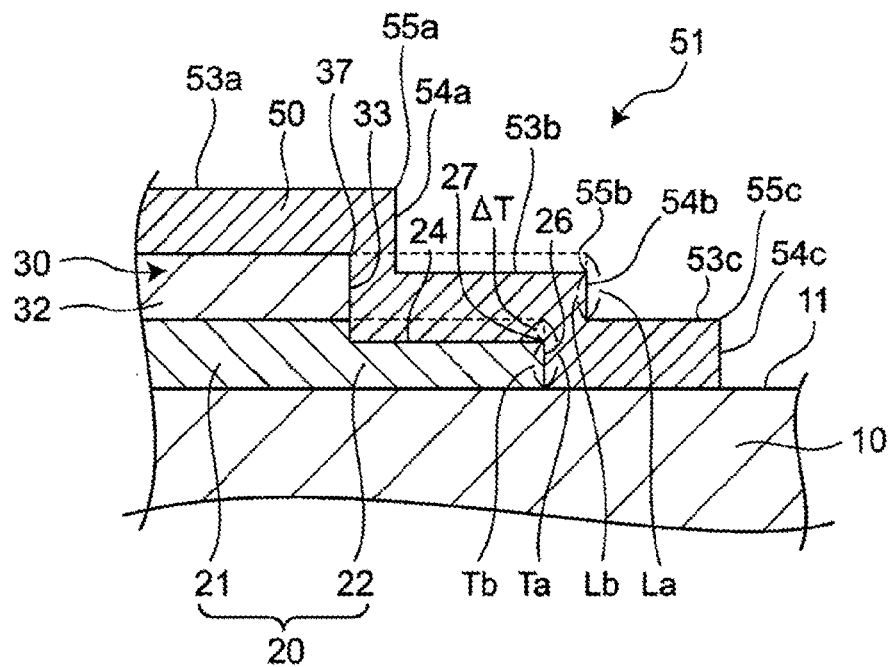
FIG. 2 is an enlarged view of an A portion in FIG. 1.

FIG. 1 is a diagram schematically illustrating a section of a semiconductor device according to a first embodiment of the present disclosure. FIG. 2 is an enlarged view of an A portion in FIG. 1. As illustrated in FIGS. 1 and 2, a semiconductor device 1 includes a semiconductor substrate 10 having a first main face 11 and a second main face 12 opposite each other, a dielectric film 20 disposed on a part of the first main face 11, a first electrode layer 30 disposed on a part (on the opposite side of the first main face 11) of the dielectric film 20, and a protective layer 50 continuously covering a range from an end portion 32 of the first electrode layer 30 to an outer peripheral end 26 of the dielectric film 20. The dielectric film 20 has an electrode layer disposing portion 21 on which the first electrode layer 30 is disposed, and a protective layer covering portion 22 covered with the protective layer 50. A thickness at the outer peripheral end 26 of the protective layer covering portion 22 of the dielectric film 20 is smaller than a thickness of the electrode layer disposing portion 21 of the dielectric film 20.

Note that in the drawing, a direction parallel to a thickness of the semiconductor device 1 is a Z direction, a forward Z direction is an upper side, and a reverse Z direction is a lower side. In a plane orthogonal to the Z direction of the semiconductor device 1, a direction parallel to a paper surface on which the drawings are illustrated is an X direction, and a direction orthogonal to the paper surface on which the drawings are illustrated is a Y direction. The X direction, the Y direction, and the Z direction are orthogonal to each other.

In the present specification, the outer peripheral end 26 of the protective layer covering portion 22 refers to an end of an outer periphery of the protective layer covering portion 22 when the protective layer covering portion 22 is viewed from the Z direction.

By a surface shape of the protective layer covering portion 22 of the dielectric film 20, a surface shape of the protective layer 50 stacked on the protective layer covering portion 22 can be determined. In the present embodiment, the thickness at the outer peripheral end 26 of the protective layer covering portion 22 of the dielectric film 20 is smaller than the thickness of the electrode layer disposing portion 21 of the dielectric film 20. That is, the protective layer covering portion 22 is understood as a thin film region having a smaller thickness at least at the outer peripheral end 26 than the electrode layer disposing portion 21. In this way, the protective layer covering portion 22 is made to be the thin film region, so that a step (more specifically, a length Lb of a second side face 54b described later) of a step portion 51 of the protective layer 50 corresponding to the outer peripheral end 26 of the dielectric film 20 is made smaller as compared with the case where the thickness of the protective layer covering portion is the same as the thickness of the electrode layer disposing portion. As a result, the occurrence of a crack can be suppressed in the vicinity of a corner portion (more specifically, a second corner portion 55b described later) of the step portion 51 of the protective layer 50 corresponding to the outer peripheral end 26 of the dielectric film 20.

In addition, a minimum thickness of the electrode layer disposing portion 21 is preferably larger than a maximum thickness of the protective layer covering portion 22. In such a case, the protective layer covering portion 22 is understood as a thin film region having a smaller thickness over the whole protective layer covering portion 22 than the electrode layer disposing portion 21. Therefore, moisture can be more effectively prevented from entering the dielectric film 20 through a crack, and deterioration in withstand voltage of the dielectric film 20 can be further suppressed.

More specifically, a thickness Tb at the outer peripheral end 26 of the protective layer covering portion 22 of the dielectric film 20 is smaller than a thickness Ta (that can be understood as the thickness at the outer peripheral end 26 of the protective layer covering portion 22 in the case where the protective layer covering portion 22 of the dielectric film 20 is not made to be the thin film region, more specifically, in the case where the thickness of the protective layer covering portion 22 of the dielectric film 20 is the same as the thickness of the electrode layer disposing portion 21 of the dielectric film 20 by $\Delta T$ (=Ta−Tb). That is, the protective layer covering portion 22 has an upper face 24 lower by the $\Delta T$ at least at the outer peripheral end 26 as compared with the case where the protective layer covering portion 22 is not made to be the thin film region.

By the surface shape of the protective layer covering portion 22 of the dielectric film 20, the surface shape of the protective layer 50 stacked on the protective layer covering portion 22 can be determined. That is, the surface shape of the protective layer 50 corresponds to the surface shape of the protective layer covering portion 22 of the dielectric film 20 below the protective layer 50, and is substantially the same as the surface shape of the protective layer covering portion 22. Therefore, a second upper face 53b of the protective layer 50 corresponds to the upper face of the protective layer covering portion 22 of the dielectric film 20, and in the illustrated aspect, these upper faces are parallel to each other (straight lines parallel to each other in the section), but the present invention is not limited thereto. The second upper face 53b is lower by the ΔT at least at the outer peripheral end 26 as compared with the case where the protective layer covering portion 22 of the dielectric film 20 is not made to be the thin film region. That is, the length Lb of the second side face 54b of the protective layer 50 corresponds to the above Tb, and a length La of the second side face 54b in the case where the protective layer covering portion 22 of the dielectric film 20 is not made to be the thin film region corresponds to the above Ta. Therefore, the Lb is shorter by the ΔT than the La (Note that in FIG. 2, the case where the La is the same as the thickness of the first electrode layer 30, in other words, the case where the thickness of the electrode layer disposing portion 21 is the same as the thickness of the first electrode layer 30, is illustrated, but the present embodiment is not limited thereto.). A second step understood as the second side face 54b between the second upper face 53b and a third upper face 53c one step down from the second upper face 53b is smaller as compared with the case where the protective layer covering portion 22 of the dielectric film 20 is not made to be the thin film region. As a result, a rate of the second step decreases in the step portion 51 of the protective layer 50. Since the rate of the second step in the step portion 51 decreases, internal stress generated in the protective layer 50 is reduced around the second corner portion 55b corresponding to a corner portion 27 of the protective layer covering portion 22.

Thus, in the protective layer 50 around the second corner portion 55b configured by the second upper face 53b and the second side face 54b of the protective layer 50, the length Lb of the second side face 54b is shortened, so that stress to around the second corner portion 55b is reduced, and the occurrence of a crack is suppressed. In addition, the occurrence of a crack is suppressed in the protective layer 50 around the corner portion 27 (corresponding to the second corner portion 55b) configured by the upper face 24 of the protective layer covering portion 22 and the outer peripheral end 26 having the thickness Tb.

In the protective layer 50, a crack occurs in the step portion 51, and more specifically, tends to occur starting from, typically, the corner portion in the vicinity of the corner portion where stress is likely to concentrate (in the illustrated aspect, a first corner portion 55a, the second corner portion 55b, and a third corner portion 55c). Among these cracks in the protective layer 50, moisture (more specifically, moisture in the atmosphere) is considered to easily enter the dielectric film 20 through the crack occurring in the vicinity of the corner portion (in the illustrated aspect, the second corner portion 55b) corresponding to the outer peripheral end 26 of the dielectric film 20. In other words, if the occurrence of the crack in the vicinity of the corner portion (second corner portion 55b) of the step portion 51 of the protective layer 50 corresponding to the outer peripheral end 26 of the dielectric film 20 can be suppressed, the entry of the moisture into the dielectric film 20 can be effectively prevented, and resultingly, deterioration in withstand voltage of the dielectric film 20 can be effectively suppressed.

According to the semiconductor device 1 of the present embodiment, as described above, the occurrence of a crack can be suppressed in the vicinity of the corner portion (second corner portion 55b) of the step portion 51 of the protective layer 50 corresponding to the outer peripheral end 26 of the dielectric film 20. Thus, the semiconductor device 1 can prevent moisture (more specifically, moisture in the atmosphere) from entering the dielectric film 20 through the crack in the protective layer 50, and can suppress deterioration in withstand voltage (reduction in dielectric breakdown strength) of the dielectric film 20.

(Semiconductor Device)

As described above, since the semiconductor device 1 can suppress the occurrence of a crack and suppress reduction in dielectric breakdown strength of the dielectric film 20, the semiconductor device 1 can operate when a high voltage of 100 V or more (more specifically, a further high voltage of 600 V or more) is applied. That is, the semiconductor device 1 has withstand voltage properties that can withstand a rated voltage of 100 V or more and further, a rated voltage of 600 V or more.

The semiconductor device 1 is, for example, a semiconductor capacitor. The semiconductor device 1 is used as, for example, a decoupling capacitor (bypass capacitor) of a high-frequency digital circuit, and is used in electronic devices such as a personal computer, a DVD player, a digital camera, a TV, a mobile phone, car electronics, and medical, industrial, and communication machines. However, the application of the semiconductor device 1 is not limited thereto, and for example, the semiconductor device 1 can also be used for a filter circuit, a rectifying and smoothing circuit, and the like.

The semiconductor device 1 may further include a second electrode layer 40 disposed on the second main face 12. In the illustrated aspect, the first electrode layer 30 and the second electrode layer 40 functioning as external connection electrodes are disposed to face each other with the semiconductor substrate 10 interposed therebetween. Note that the semiconductor device 1 may further include the external connection electrode electrically connected to each of the first electrode layer 30 and the second electrode layer 40. In the semiconductor device 1, the first electrode layer 30 and the second electrode layer 40 (alternatively, the external connection electrodes, if present) can be electrically connected to wiring of a circuit board, not illustrated, by wires or solder bumps.

However, the second electrode layer 40 may be disposed between the semiconductor substrate 10 and the dielectric film 20. At this time, the first electrode layer 30 functioning as the external connection electrode and the external connection electrode electrically connected to the second electrode layer 40 may be disposed on the same XY plane so as to be separated from each other.

(Semiconductor Substrate)

The semiconductor substrate 10 has the first main face 11 and the second main face 12 opposite each other. As illustrated in FIG. 1, a sectional shape of the semiconductor substrate 10 is substantially rectangular.

A material of the semiconductor substrate 10 may be any of, for example, silicon (Si), SiC, and GaN. The semiconductor substrate 10 can be doped with impurities (dopants) for the purpose of adjusting conductivity or the like. A dopant (donor) for supplying electrons is, for example, an element of Group 15 (more specifically, phosphorus and the like). A dopant (acceptor) that supplies holes is an element of Group 13 (more specifically, boron and the like). The semiconductor substrate 10 may be an n-type semiconductor substrate or a p-type semiconductor substrate. An electric resistance value of the semiconductor substrate 10 is, for example, 0.001 Ωcm to 100 Ωcm.

A thickness of the semiconductor substrate 10 is, for example, 100 µm to 700 µm. Note that in the present specification, the thickness refers to a length in the Z direction.

(Dielectric Film)

The dielectric film 20 is disposed on a part of the first main face 11. The dielectric film 20 has an electrode layer disposing portion 21 on which the first electrode layer 30 is disposed, and a protective layer covering portion 22 covered with the protective layer 50.

The electrode layer disposing portion 21 of the dielectric film 20 mainly adjusts electric capacitance. The protective layer covering portion 22 of the dielectric film 20 mainly secures insulation properties between the semiconductor substrate 10 and the first electrode layer 30. That is, the protective layer covering portion 22 of the dielectric film 20 suppresses the occurrence of creepage discharge (and optionally air discharge) between an exposing portion of the first electrode layer 30 (or the external connection electrode, if present) and an exposing portion of the semiconductor substrate 10 (more specifically, the first main face 11).

A material of the dielectric film 20 is, for example, a Si-based material (more specifically, silicon oxide ($SiO_2$) or the like). The dielectric film 20 is preferably made of silicon oxide. When the dielectric film 20 is made of the silicon oxide, the electric capacitance of the semiconductor device 1 can be increased.

The thickness Tb at the outer peripheral end 26 of the protective layer covering portion 22 of the dielectric film 20 is smaller than the thickness Ta of the electrode layer disposing portion 21 of the dielectric film 20. The thickness Ta of the electrode layer disposing portion 21 of the dielectric film 20 is, for example, 0.1 µm to 3 µm.

As illustrated in FIGS. 1 and 2, a sectional shape of the protective layer covering portion 22 of the dielectric film 20 may be substantially rectangular. The protective layer covering portion 22 (thin film region) of the dielectric film 20 is formed by, for example, over-etching as described later in a method for manufacturing the semiconductor device 1. In such a case, the upper face 24 of the protective layer covering portion 22 of the dielectric film 20 becomes rough as compared with the case where the upper face 24 is formed by a method other than over-etching. For this reason, a contact area between the upper face 24 of the protective layer covering portion 22 of the dielectric film 20 and the protective layer 50 increases, and close contact properties between the upper face 24 of the protective layer covering portion 22 of the dielectric film 20 and the protective layer 50 are improved.

A width (length of the upper face 24) of the protective layer covering portion 22 of the dielectric film 20 is, for example, 0.1 µm to 30 µm. When the length of the protective layer covering portion 22 of the dielectric film 20 is 0.1 µm to 30 µm, insulation properties between an end face 33 of the first electrode layer 30 and the first main face 11 is improved.

(First Electrode Layer)

The first electrode layer 30 forms an electric field with the second electrode layer 40. The first electrode layer 30 is disposed on the electrode layer disposing portion 21 that is a part of the dielectric film 20. The first electrode layer 30 faces the second electrode layer 40 with the semiconductor substrate 10 interposed therebetween.

A material of the first electrode layer 30 is, for example, metal or other conductive material (more specifically, conductive resin, polysilicon, and the like). The metal is, for example, Mo (molybdenum), Al (aluminum), Au (gold), W (tungsten), Pt (platinum), Ti (titanium), or the like. Among these, from the viewpoint of enhancing conductivity and moisture resistance, the material of the first electrode layer 30 is preferably metal and polysilicon, and more preferably Al and polysilicon. That is, the first electrode layer 30 is preferably made of polysilicon or Al. Enhancing the moisture resistance of the first electrode layer 30 means, for example, preventing moisture from entering the dielectric film 20 through the first electrode layer 30 by the first electrode layer 30 made of polysilicon or Al, and suppressing reduction in insulation strength.

(Second Electrode Layer)

The second electrode layer 40 can be disposed on the second main face 12 of the semiconductor substrate 10. A material of the second electrode layer 40 is, for example, metal or other conductive material (more specifically, conductive resin, polysilicon (polycrystalline silicon), and the like). The metal is, for example, Mo (molybdenum), Al (aluminum), Au (gold), W (tungsten), Pt (platinum), Ti (titanium), or the like. Note that the second electrode layer 40 may be disposed between the semiconductor substrate 10 and the dielectric film 20.

(Protective Layer)

The protective layer 50 continuously covers a range from the end portion 32 of the first electrode layer 30 to the first main face 11 of the semiconductor substrate 10. That is, the protective layer 50 continuously covers the end portion 32 of the first electrode layer 30 in the range from the end portion 32 of the first electrode layer 30 to the first main face 11 of the semiconductor substrate 10, the protective layer covering portion 22 of the dielectric film 20, and a part of the first main face 11 of the semiconductor substrate 10 without interruption.

The protective layer 50 has, for example, the step portion 51 in which an upper face 53 is lowered stepwise. The protective layer 50 mainly protects the protective layer covering portion 22. The protective layer 50 inhibits the entry of moisture from the outside of the semiconductor device 1, and suppresses reduction in dielectric breakdown strength of the dielectric film 20. In addition, the protective layer 50 suppresses the occurrence of creepage discharge (and optionally air discharge) between the exposing portion of the first electrode layer 30 (or the external connection electrode, if present) and the exposing portion of the semiconductor substrate 10 (more specifically, the first main face 11).

A material of the protective layer 50 is, for example, silicon nitride (SiN) from the viewpoint of improving moisture resistance of the protective layer 50. That is, the protective layer 50 is made of, for example, the silicon nitride.

The step portion 51 of the protective layer 50 is configured to have a corner portion 55 from the upper face 53 and a side face 54, and more specifically, is configured to have the first to third corner portions 55a to 55c from three pairs of the first to third upper faces 53a to 53c and the first to third side faces 54a to 54c. In the illustrated aspect, the step portion 51 includes, on the surface of the protective layer 50, the first upper face 53a and the first side face 54a that form the first corner portion 55a, the second upper face 53b and the second side face 54b that form the second corner portion 55b, and the third upper face 53c and the third side face 54c that form the third corner portion 55c. In other words, the step portion 51 has a first step (corresponding to the first side face 54a) between the first upper face 53a and the second upper face 53b, the second step (corresponding to the second side face 54b) between the second upper face 53b and the third upper face 53c, and a third step (corresponding to the third side surface 54c) between the third upper face 53c and the first main face 11, and is formed to be sequentially lowered stepwise on the surface of the protective layer 50.

For each step, the shapes of the upper face and the side face configuring the step and the shape of the corner portion formed by the upper face and the side face are not limited to the illustrated aspect (sectional shape). The first upper face 53a, the second upper face 53b, and the third upper face 53c may be parallel to each other (straight lines parallel to each other in the section), but are not limited thereto. Actually, the first upper face 53a, the second upper face 53b, and the third upper face 53c may be inclined, curved, or uneven. In addition, the first side face 54a, the second side face 54b, and the third side face 54c may also be parallel to each other, but are not limited thereto, and may actually be inclined, curved, or uneven. The upper faces 53a to 53c and the side faces 54a to 54c may be connected at a substantially perpendicular angle (about) 90°, respectively, or may be connected at an angle other than the substantially perpendicular angle (about 90°), respectively. The first corner portion 55a, the second corner portion 55b, and the third corner portion 55c may have a substantially right angle (about 90°), but are not limited thereto, and may actually be rounded or partly missing. Note that in the present specification, the terms "substantially perpendicular angle (about 90°)" and "substantially right angle (about 90°)" are not limited to 90°, and include angles around 90° in consideration of a realistic variation range. The term "angle other than the substantially perpendicular angle (about 90°)" may be any suitable angle that exceeds the realistic variation range.

Note that the protective layer covering portion 22 of the dielectric film 20 may be modified to be lowered stepwise or continuously toward the outer peripheral end 26. The aspect in which the protective layer covering portion 22 is lowered stepwise is, for example, an aspect in which the protective layer covering portion 22 has two or more upper faces and is lowered stepwise. The aspect in which the protective layer covering portion 22 is continuously lowered is, for example, an aspect in which the protective layer covering portion 22 is continuously lowered by one or more types of straight lines or curves. Such modifications will be described in detail in a fourth embodiment.

A thickness of the protective layer 50 is, for example, 0.1 µm to 3 µm. When the thickness of the protective layer 50 is 0.1 µm to 3 µm, the entry of moisture from the outside of the semiconductor device 1 can be prevented, and the occurrence of creepage discharge (and optionally air discharge) between the exposing portion of the first electrode layer 30 (or the external connection electrode, if present) and the exposing portion of the semiconductor substrate 10 (more specifically, the first main face 11) can be suppressed. The thickness of the protective layer 50 is typically the thickness of the protective layer 50 on the protective layer covering portion 22 of the dielectric film 20, and more specifically, can be a distance between the upper face 24 of the protective layer covering portion 22 and the second upper face 53b of the protective layer 50.

The thickness of the protective layer 50 can be equal to or larger than the thickness of the electrode layer disposing portion 21 of the dielectric film 20. In such a case, internal stress generated in the protective layer 50 around the protective layer covering portion 22 of the dielectric film 20 can be further reduced. As a result, the occurrence of a crack in the step portion 51 of the protective layer 50 is further suppressed. In addition, since the thickness of the protective layer 50 is larger than the thickness of the electrode layer disposing portion 21 of the dielectric film 20, the moisture resistance of the protective layer 50 increases. Further, when the thickness of the protective layer 50 becomes large, the creepage distance of the protective layer 50, more specifically, a distance of the surface of the protective film 50 between the exposing portion of the first electrode layer 30 (portion not covered with the protective layer 50) and the exposing portion of the semiconductor substrate 10 (portion not covered with the protective layer 50) (typically, the shortest distance between these exposing portions) increases. This makes it possible to suppress the occurrence of creepage discharge (and optionally air discharge) between the exposing portion of the first electrode layer 30 (or the external connection electrode, if present) and the exposing portion of the semiconductor substrate 10 (more specifically, the first main face 11).

A length in a width direction of the protective layer covering portion 22 is larger than the thickness of the protective layer covering portion 22. In the present specification, the length in the width direction is the length in the X direction. Thus, the second corner portion 55b of the step portion 51 of the protective layer 50 can be disposed away from the electrode layer disposing portion 21 of the dielectric film 20. In such a case, if a crack occurs in the second corner portion 55b of the step portion 51 of the protective layer 50, moisture hardly reaches the electrode layer disposing portion 21 of the dielectric film 20 through the crack. Therefore, reduction in dielectric breakdown strength of the dielectric film 20 is further suppressed.

[A Method for Manufacturing the Semiconductor Device]

Next, an example of a method for manufacturing the semiconductor device 1 will be described.

The method for manufacturing the semiconductor device 1 includes a dielectric film forming step of forming the dielectric film 20 (more specifically, a precursor of the dielectric film 20 described above with reference to FIGS. 1 to 2, including the electrode layer disposing portion 21 and a portion to be the protective layer covering portion 22 later) on a part of the first main face 11 of the semiconductor substrate 10, a first electrode layer forming step of forming the first electrode layer 30 on the dielectric film 20 and removing a part of the dielectric film 20 to form the protective layer covering portion 22 (thin film region) (thereby, the dielectric film 20 having the electrode layer disposing portion 21 and the protective layer covering portion 22 is formed), a protective layer forming step of forming the protective layer 50 continuously covering the range from the end portion 32 of the first electrode layer 30 to the first main face 11, and a second electrode layer forming step of forming the second electrode layer 40 on the second main face 12 of the semiconductor substrate 10.

The method for manufacturing the semiconductor device 1 can further include a dicing step of cutting a structure body (mother integration body) having a plurality of semiconductor device structures obtained above with a dicing machine.

Specifically, an example of the method for manufacturing the semiconductor device 1 will be described with reference to FIGS. 3A to 3E. FIGS. 3A to 3E are views for explaining the method for manufacturing the semiconductor device 1. The method for manufacturing the semiconductor device 1 includes the dielectric film forming step, the first electrode layer forming step, the protective layer forming step, the second electrode layer forming step, and the dicing step. Note that although the mother integration body in which the semiconductor devices 1 are integrated is manufactured from the dielectric film forming step to the second electrode layer forming step, for convenience of description, the manufacturing method will be described by focusing on one semiconductor device 1.

(Dielectric Film Forming Step)

Figure 3A:
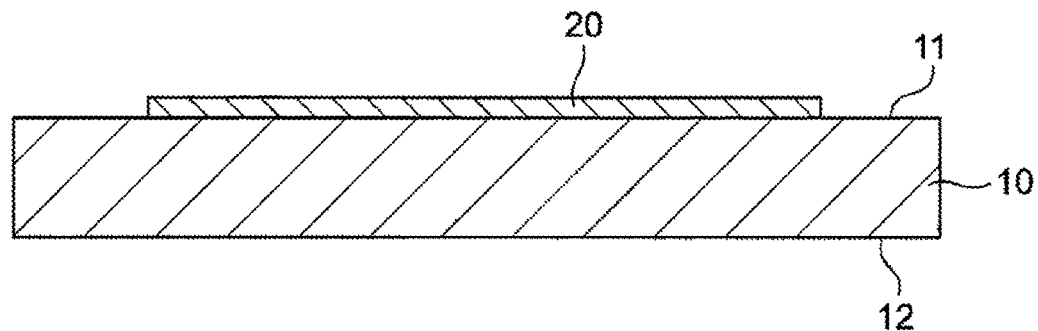
FIG. 3A is an explanatory view for explaining a method for manufacturing the semiconductor device.

In the dielectric film forming step, as illustrated in FIG. 3A, the dielectric film 20 is formed on a part of the first main face 11 of the semiconductor substrate 10. In the dielectric film forming step, for example, the dielectric film 20 is formed on the first main face 11 of the semiconductor substrate 10, and the dielectric film 20 is patterned. Specifically, a silicon substrate is prepared as the semiconductor substrate 10. For example, the dielectric film 20 of $SiO_2$ is formed on the first main face 11 of the semiconductor substrate 10 by using a chemical vapor deposition method (CVD method) so as to have a thickness of 0.1 to 3 μm.

Next, the dielectric film 20 formed on the first main face 11 of the semiconductor substrate 10 is patterned by a photolithography method and a dry etching method. For example, in the photolithography method, a liquid resist is spin-coated to form a photoresist film on the dielectric film 20. The photoresist film is exposed through a mask corresponding to a predetermined pattern. The exposed photoresist film is developed. In the dry etching method, for example, the dielectric film 20 not covered with the photoresist film is selectively removed by using reactive ion etching (RIE). Thereafter, the photoresist film is removed. Thus, the dielectric film 20 (more specifically, a precursor of the dielectric film 20 described above with reference to FIGS. 1 to 2, including the electrode layer disposing portion 21 and a portion to be the protective layer covering portion 22 later) having the predetermined pattern is formed on the first main face 11 of the semiconductor substrate 10.

(First Electrode Layer Forming Step)

Figure 3B:
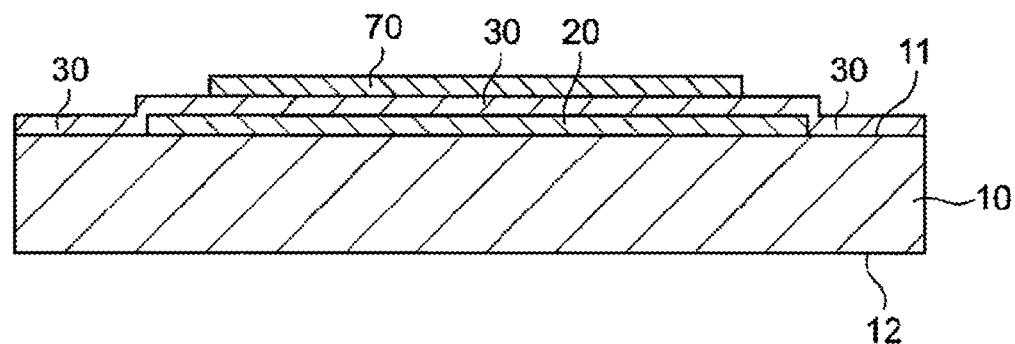
FIG. 3B is an explanatory view for explaining the method for manufacturing the semiconductor device.
Figure 3C:
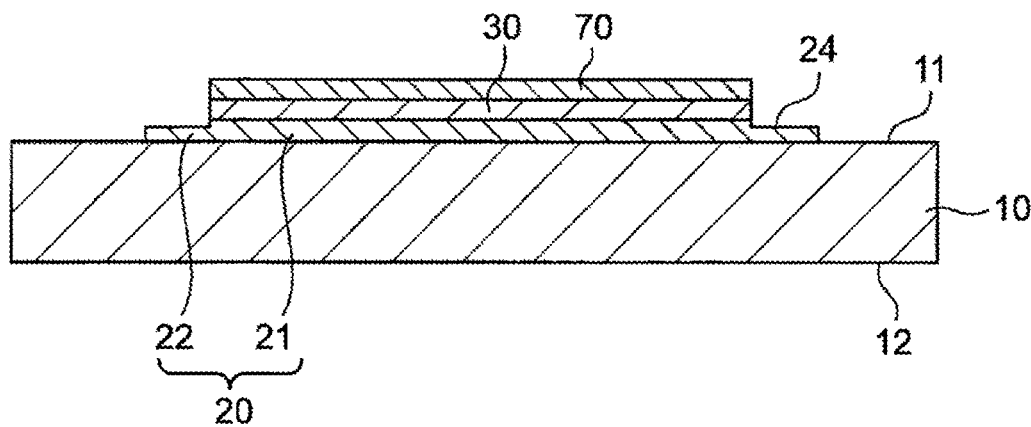
FIG. 3C is an explanatory view for explaining the method for manufacturing the semiconductor device.

In the first electrode layer forming step, as illustrated in FIGS. 3B and 3C, the first electrode layer 30 is formed on the dielectric film 20, and a part of the dielectric film 20 is removed to form the protective layer covering portion 22 (thin film region). In the first electrode layer forming step, for example, the first electrode layer 30 is formed on the first main face 11 of the semiconductor substrate 10 on which the dielectric film 20 is disposed, and the first electrode layer 30 is patterned. Specifically, as illustrated in FIG. 3B, for example, the first electrode layer 30 of Al is formed on the first main face 11 of the semiconductor substrate 10 on which the dielectric film 20 is disposed by a sputtering method or a vacuum vapor deposition method so as to have a thickness of 0.1 to 3 μm.

Next, the first electrode layer 30 is patterned by the photolithography method and the dry etching method. Specifically, as illustrated in FIG. 3B, a mask layer (more specifically, a photoresist layer) 70 is formed by patterning on the first electrode layer 30. Next, as illustrated in FIG. 3C, the first electrode layer 30 is patterned. In the patterning of the first electrode layer 30, the unnecessary first electrode layer 30 that does not configure the desired pattern is removed. Further, a part of the dielectric film 20 is also removed by over-etching. Next, the mask layer 70 is removed. Thus, the first electrode layer 30 having the predetermined pattern is formed, and the protective layer covering portion 22 (thin film region) of the dielectric film 20 is formed.

Since the upper face 24 of the protective layer covering portion 22 of the dielectric film 20 is formed by the etching process, the upper face 24 becomes rough as compared with the case where the etching process is not performed. When the upper face 24 becomes rough, the contact area between the upper face 24 and the protective layer 50 formed in the subsequent protective layer forming step increases, and the close contact properties between the protective layer covering portion 22 of the dielectric film 20 and the protective layer 50 are improved.

(Protective Layer Forming Step)

Figure 3D:
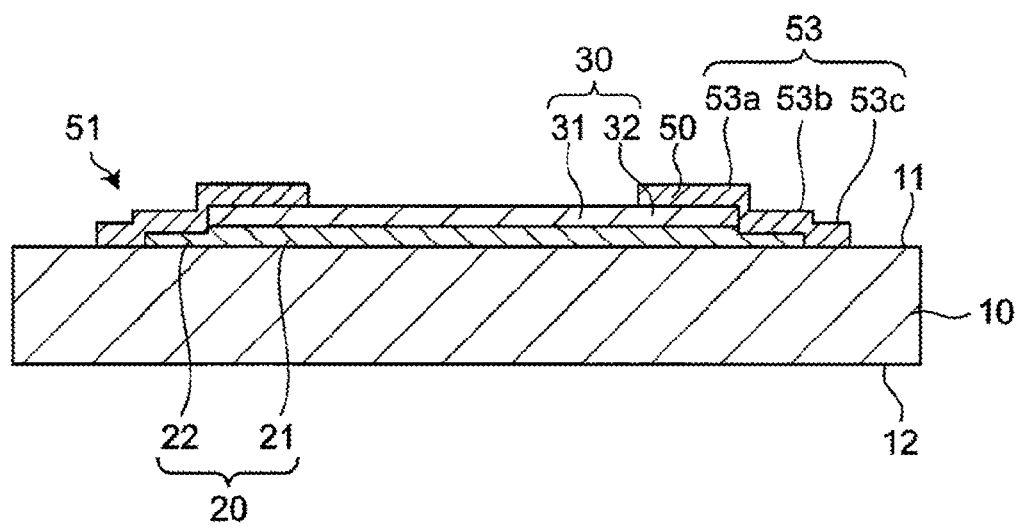
FIG. 3D is an explanatory view for explaining the method for manufacturing the semiconductor device.

In the protective layer forming step, as illustrated in FIG. 3D, the protective layer 50 continuously covering the range from the end portion 32 of the first electrode layer 30 to the first main face 11 is formed. Specifically, for example, the protective layer 50 of SiN is formed by using the sputtering method or the vacuum vapor deposition method, and patterning is performed by using the photolithography method or the dry etching method. As described above, the protective layer 50 is formed. In addition, the protective layer 50 is formed to have a thickness of 0.1 to 3 μm. Thus, the protective layer 50 continuously covering the range from the end portion 32 of the first electrode layer 30 to the first main face 11 is formed.

(Second Electrode Layer Forming Step)

Figure 3E:
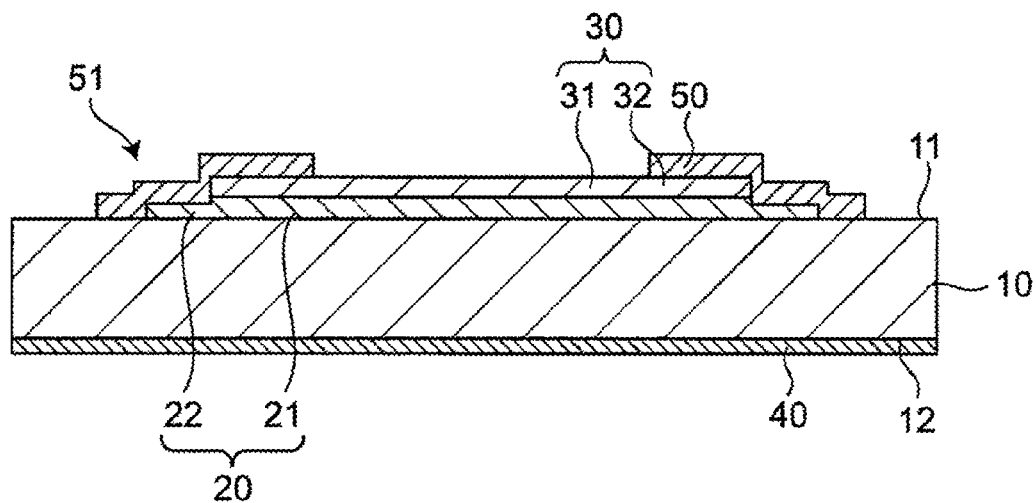
FIG. 3E is an explanatory view for explaining the method for manufacturing the semiconductor device.

In the second electrode layer forming step, as illustrated in FIG. 3E, the second electrode layer 40 is formed on the second main face 12 of the semiconductor substrate 10. Specifically, in the second electrode layer forming step, the second electrode layer 40 is formed on the second main face 12 of the semiconductor substrate 10 by using, for example, the sputtering method and the vacuum vapor deposition method. In this way, the mother integration body is obtained. In the second electrode layer forming step, before the second electrode layer 40 is formed on the second main face 12, the second main face 12 may be subjected to a grinding process by grinding.

(Dicing Step)

In the dicing step, the mother integration body is cut with a dicing machine to manufacture the semiconductor device 1.

Second Embodiment

[Configuration]

Figure 4:
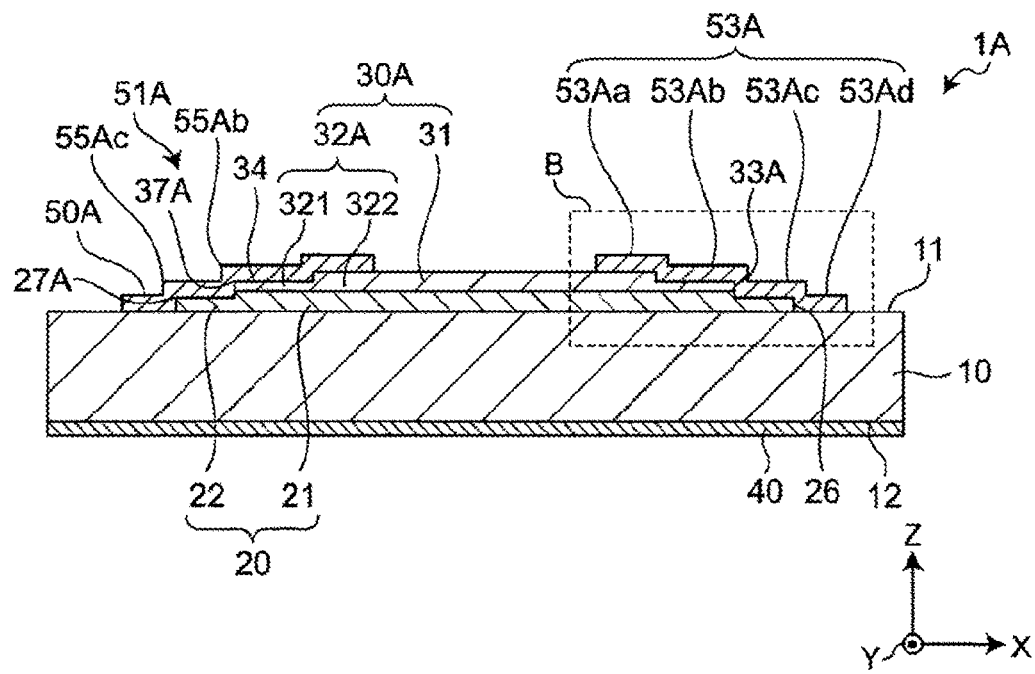
FIG. 4 is a sectional view illustrating a second embodiment of a semiconductor device.
Figure 5:
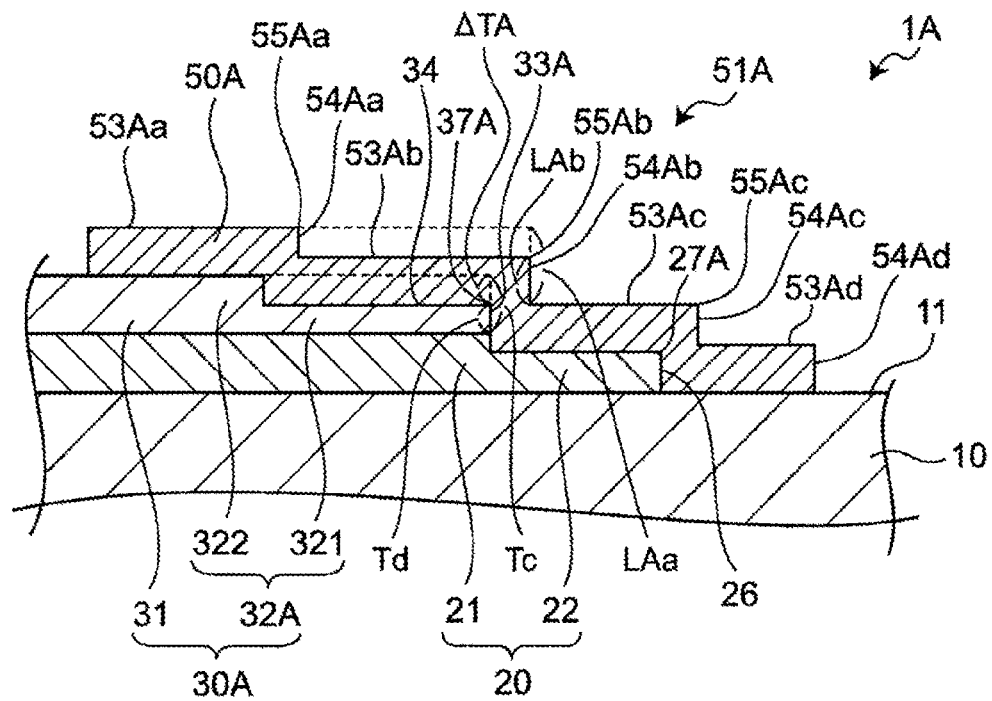
FIG. 5 is an enlarged view of a B portion in FIG. 4.

FIG. 4 is a diagram schematically illustrating a section of a semiconductor device 1A according to a second embodiment. FIG. 5 is an enlarged view of a B portion in FIG. 4. The second embodiment is a modification of the first embodiment, and is different from the first embodiment in that a first electrode layer 30A has a thin film region (first end portion 321). This different configuration will be described below. Note that in the second embodiment, the same reference numerals as those in the first embodiment have the same configurations as those in the first embodiment, and thus the description thereof will be omitted.

As illustrated in FIGS. 4 and 5, in the semiconductor device 1A according to the second embodiment, an end portion 32A of the first electrode layer 30A has the first end portion 321 having an outer peripheral end 33A, and a second end portion 322 adjacent to the first end portion 321 and extending toward a center portion 31 side of the first electrode layer 30A. A thickness at the outer peripheral end 33A of the first end portion 321 is smaller than a thickness of the second end portion 322.

In the present specification, the outer peripheral end 33A of the first electrode layer 30A refers to an end of an outer periphery of the first electrode layer 30A when the first electrode layer 30A is viewed from the Z direction.

By a surface shape of the first end portion 321 of the first electrode layer 30A, a surface shape of a protective layer 50A stacked on the first end portion 321 can be determined. In the present embodiment, the thickness at the outer peripheral end 33A of the first end portion 321 of the first electrode layer 30A is smaller than the thickness of the second end portion 322. That is, the first end portion 321 is understood as the thin film region having a smaller thickness at least at the outer peripheral end 33A than the second end portion 322. In this way, since the first electrode layer 30A has the first end portion 321 as the thin film region, a step (more specifically, a length LAb of a second side face 54Ab described later) of a step portion 51A of the protective layer 50A corresponding to the outer peripheral end 33A of the first electrode layer 30A is made smaller as compared with the case where the first electrode layer 30 does not have the thin film region as in the first embodiment. As a result, the occurrence of a crack can be suppressed in the vicinity of a corner portion (more specifically, a second corner portion 55Ab described later) of the step portion 51A of the protective layer 50A corresponding to the outer peripheral end 33A of the first electrode layer 30A, and the occurrence of a crack can be further suppressed in the whole protective layer 50A as compared with the first embodiment.

In the present embodiment, the first end portion 321 is understood as a thin film region having a smaller thickness over the whole first end portion 321 than the second end portion 322.

More specifically, a thickness Td at the outer peripheral end 33A of the first end portion 321 is smaller than a thickness Tc (that can be understood as the thickness at the outer peripheral end 33A of the first end portion 321 in the case where the first end portion 321 is not made to be the thin film region, more specifically, in the case where the thickness of the first end portion 321 is the same as the thickness of the second end portion 322.) of the second end portion 322 by ΔTA (=Tc−Td). That is, the first electrode layer 30A has an upper face 34 that is lower by the ΔTA at least at the outer peripheral end 33A as compared with the case where the first end portion 321 is not made to be the thin film region.

By a surface shape of the first end portion 321 of the first electrode layer 30A, a surface shape of the protective layer 50A stacked on the first end portion 321 can be determined. That is, the surface shape of the protective layer 50A corresponds to the surface shape of the first end portion 321 below the protective layer 50A, and is substantially the same as the surface shape of the first end portion 321. Therefore, a second upper face 53Ab of the protective layer 50A corresponds to the upper face 34 of the first end portion 321, and in the illustrated aspect, these upper faces are parallel to each other (straight lines parallel to each other in the section), but the present invention is not limited thereto. The second upper face 53Ab of the protective layer 50A is lower by the ΔTA at least at the outer peripheral end 33A as compared with the case where the first end portion 321 is not made to be the thin film region. That is, the length LAb of the second side face 54Ab of the protective layer 50A corresponds to the above Td, and a length LAa of the second side face in the case where the first end portion 321 is not made to be the thin film region corresponds to the above Tc, and thus the LAb is shorter by the ΔTA than the LAa. A second step understood as the second side face 54Ab between the second upper face 53Ab and a third upper face 53Ac one step down from the second upper face 53Ab is smaller as compared with the case where the first end portion 321 of the first electrode layer 30A is not made to be the thin film region. As a result, a rate of the second step decreases in the step portion 51A of the protective layer 50A. Then, internal stress generated in the protective layer 50A is reduced around the second corner portion 55Ab corresponding to a corner portion 37A of the first end portion 321 of the first electrode layer 30A, and the internal stress accumulated in the whole protective layer 50A can be further reduced as compared with the first embodiment.

Thus, the occurrence of a crack is suppressed in the protective layer 50A around the second corner portion 55Ab configured by the second upper face 53Ab and the second side face 54Ab of the protective layer 50A. In addition, the occurrence of a crack is suppressed in the protective layer 50A around the corner portion 37A (corresponding to the second corner portion 55Ab) configured by the upper face 34 of the first end portion 321 and the outer peripheral end (end face) 33A having the thickness Td.

According to the semiconductor device 1A of the present embodiment, similarly to the semiconductor device 1 described above in the first embodiment, the occurrence of a crack can be suppressed in the vicinity of a corner portion (third corner portion 55Ac) of the step portion 51A of the protective layer 50A corresponding to the outer peripheral end 26 of the dielectric film 20. Further, according to the semiconductor device 1A of the present embodiment, as described above, the occurrence of a crack can be suppressed in the vicinity of the corner portion (second corner portion 55Ab) of the step portion 51A of the protective layer 50A corresponding to the outer peripheral end 33A of the first electrode layer 30A. Thus, the semiconductor device 1A can more effectively prevent moisture from entering the dielectric film 20 through the crack in the protective layer 50A, and can more effectively suppress reduction in dielectric breakdown strength of the dielectric film 20.

In the first embodiment, the height of the second upper face 53b of the step portion 51 of the protective layer 50 can be reduced by reduction in the height of the upper face 24 of the protective layer covering portion 22 of the dielectric film 20. On the other hand, in the step portion 51, a first step (corresponding to the first side face 54a) configured by the first upper face 53a and the second upper face 53b lowered by one step from the first upper face 53a becomes large. With respect to the first step that becomes large, in the second embodiment, by providing the thin film region in the first electrode layer, in the step portion 51A, the occurrence of a crack is suppressed by two steps of the first step (corresponding to the first side face 54a) configured by a first upper face 53Aa and the second upper face 53Ab lowered by one step from the first upper face 53Aa and the second step (corresponding to a second side face 54Ab) configured by the second upper face 53Ab and the third upper face 53Ac lowered by one step from the second upper face 53Ab.

The thickness Tc of the center portion 31 and the second end portion 322 of the first electrode layer 30A is, for example, 0.1 to 3 μm.

As illustrated in FIGS. 4 and 5, a sectional shape of the first end portion 321 of the first electrode layer 30A may be substantially rectangular. The first end portion 321 (thin film region) of the first electrode layer 30A is formed by, for example, etching, as described later in a method for manufacturing the semiconductor device 1A. In such a case, the upper face 34 of the first end portion 321 of the first electrode layer 30A becomes rough as compared with the case where the upper face 34 is formed by a method other than etching. Therefore, a contact area between the upper face 34 of the first end portion 321 of the first electrode layer 30A and the protective layer 50A increases, and close contact properties between the upper face 34 of the first end portion 321 of the first electrode layer 30A and the protective layer 50A are improved.

The step portion 51A of the protective layer 50A is configured to have a corner portion 55 from an upper face 53A and a side face 54A, and more specifically, is configured to have the first to fourth corner portions 55Aa to 55Ad from four pairs of the first to fourth upper faces 53Aa to 53Ad and the first to fourth side faces 54Aa to 54Ad. In the illustrated aspect, the step portion 51A includes, on the surface of the protective layer 50A, the first upper face 53Aa and the first side face 54Aa that form the first corner portion 55Aa, the second upper face 53Ab and the second side face 54Ab that form the second corner portion 55Ab, the third upper face 53Ac and the third side face 54Ac that form the third corner portion 55Ac, and the fourth upper face 53Ad and the fourth side face 54Ad that form the fourth corner portion 55Ad. In other words, the step portion 51A has the first step (corresponding to the first side face 54Aa) between the first upper face 53Aa and the second upper face 53Ab, the second step (corresponding to the second side face 54Ab) between the second upper face 53Ab and the third upper face 53Ac, the third step (corresponding to the third side face 54Ac) between the third upper face 53Ac and the fourth upper face 53Ad, and a fourth step (corresponding to the fourth side face 54Ad) between the fourth upper face 53Ad and the first main face 11, and is formed to be sequentially lowered stepwise on the surface of the protective layer 50A.

For each step, the shapes of the upper face and the side face configuring the step and the shape of the corner portion formed by the upper face and the side face are not limited to the illustrated aspect (sectional shape), and the same description as the description in the first embodiment can be applied to the present embodiment.

Note that the first end portion 321 of the first electrode layer 30A may be lowered stepwise or continuously toward the outer peripheral end 33A. The aspect in which the first end portion 321 is lowered stepwise is, for example, an aspect in which the first end portion 321 has two or more upper faces and is lowered stepwise. The aspect in which the first end portion 321 is continuously lowered is, for example, an aspect in which the first end portion 321 is continuously lowered by one or more types of straight lines or curves.

[A Method for Manufacturing the Semiconductor Device]

A method for manufacturing the semiconductor device 1A is the same as that of the first embodiment except that a first electrode layer thin film region forming process is performed in the first electrode layer forming step in the method for manufacturing the semiconductor device 1.

(First Electrode Layer Thin Film Region Forming Process)

In the first electrode layer thin film region forming process, the thin film region is formed at the end portion 32A of the first electrode layer 30A. Specifically, after a part of the dielectric film 20 is removed to form the protective layer covering portion 22 (thin film region), a mask layer is formed so as to cover a portion other than the first end portion 321 of the end portion 31A of the first electrode layer 30A. A part of the first end portion 321 of the end portion 31A is removed by a dry etching method. Next, the mask layer is removed. Thus, the end portion 32A of the first electrode layer 30A having the thin film region (first end portion 321) is formed. In addition, since the upper face 34 of the first end portion 321 of the first electrode layer 30A is formed by etching, surface roughness of the upper face 34 of the first electrode layer 30A is larger as compared with the case where the etching process is not performed. Therefore, the close contact properties between the protective layer 50A formed in the subsequent protective layer forming step and the first electrode layer 30A are improved.

Third Embodiment

[Configuration]

Figure 6:
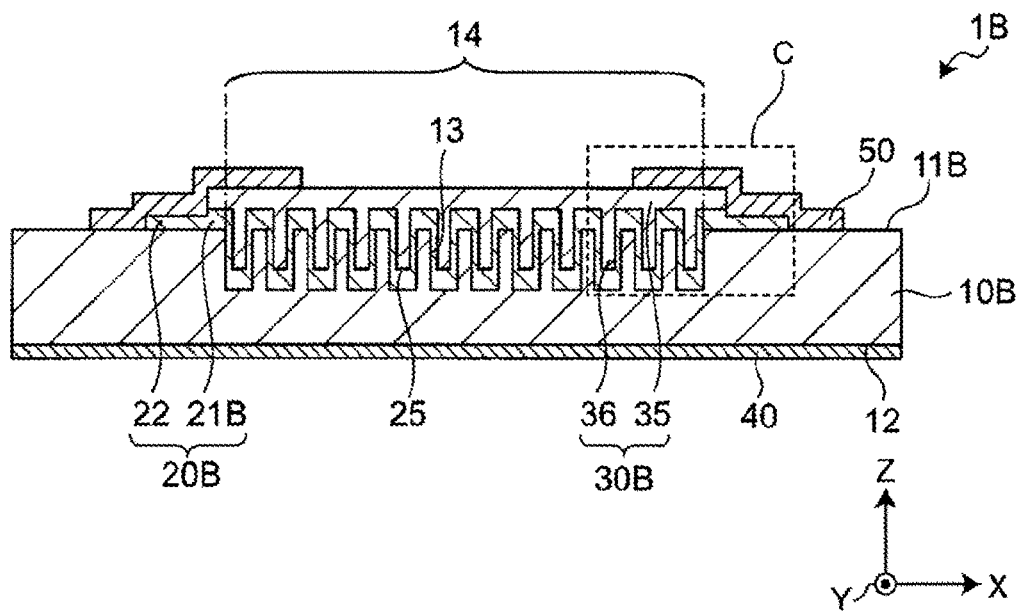
FIG. 6 is a sectional view illustrating a third embodiment of a semiconductor device.

FIG. 6 is a diagram schematically illustrating a section of a semiconductor device 1B according to a third embodiment. The third embodiment is a modification of the first embodiment, and is different from the first embodiment in having a trench structure (groove structure). This different configuration will be described below. Note that in the third embodiment, the same reference numerals as those in the first embodiment have the same configurations as those in the first embodiment, and thus the description thereof will be omitted.

As illustrated in FIG. 6, in the semiconductor device 1B according to the third embodiment, a semiconductor substrate 10B has a trench (groove) 13 on a first main face 11B on which an electrode layer disposing portion 21B of a dielectric film 20B is disposed. The electrode layer disposing portion 21B of the dielectric film 20B is disposed on the first main face 11B including an inner face of the trench 13 so as to cover the inner face of the trench 13 to form a recess portion 25. A first electrode layer 30B has an entering portion 36 entering the recess portion 25.

Since the semiconductor device 1B has a trench structure 14, an area of an interface configured by the dielectric film 20B and the first electrode layer 30B increases as compared with the semiconductor device not having the trench structure. Thus, the semiconductor device 1B can increase electric capacitance.

The electrode layer disposing portion 21B of the dielectric film 20B has the recess portion 25 covering the inner face of the trench 13. The first electrode layer 30B has a planar portion 35 and the entering portion 36. The entering portion 36 extends in the reverse Z direction from the planar portion 35, and fills the recess portion 25. The first electrode layer 30B has a comb shape.

As illustrated in FIG. 6, a shape of the entering portion 36 (sectional shape on the ZX plane) is a rectangular shape extending in the reverse Z direction. In addition, a shape of the entering portion 36 (sectional shape on the XY plane) is, for example, a polygon (more specifically, a quadrangle, a pentagon, a hexagon, and the like) and a circle.

The shape of the entering portion 36 (sectional shape on the ZX plane) is a shape in which the lower end portion thereof has a bottom face. A shape of the bottom face is, for example, a polygon (more specifically, a quadrangle, a pentagon, and a hexagon), a circle, or the like. Note that the shape of the entering portion 36 (sectional shape on the ZX plane) is not limited to the shape in which the lower end portion thereof has the bottom face, and may be, for example, a semicircular arc shape.

The entering portion 36 can have a tapered (inclined) side face (inner face). That is, the entering portion 36 may have a shape in which the width (length in the X direction) increases or decreases from the lower end portion thereof toward the first main face 11B. The recess portion 25 can also be tapered on outer and inner faces of a side face thereof.

The recess portion 25 and the entering portion 36 are disposed along the X direction. For example, the recess portion 25 and the entering portion 36 may be disposed in a matrix when a section (section taken along the XY plane)

including the recess portion 25 and the entering portion 36 is viewed from a direction perpendicular to the first main face 11B.

A density of the recess portion 25 and the entering portion 36 (the number of trenches 13 per unit area of the first main face 11B) is, for example, about 15000/mm$^2$.

Figure 7:
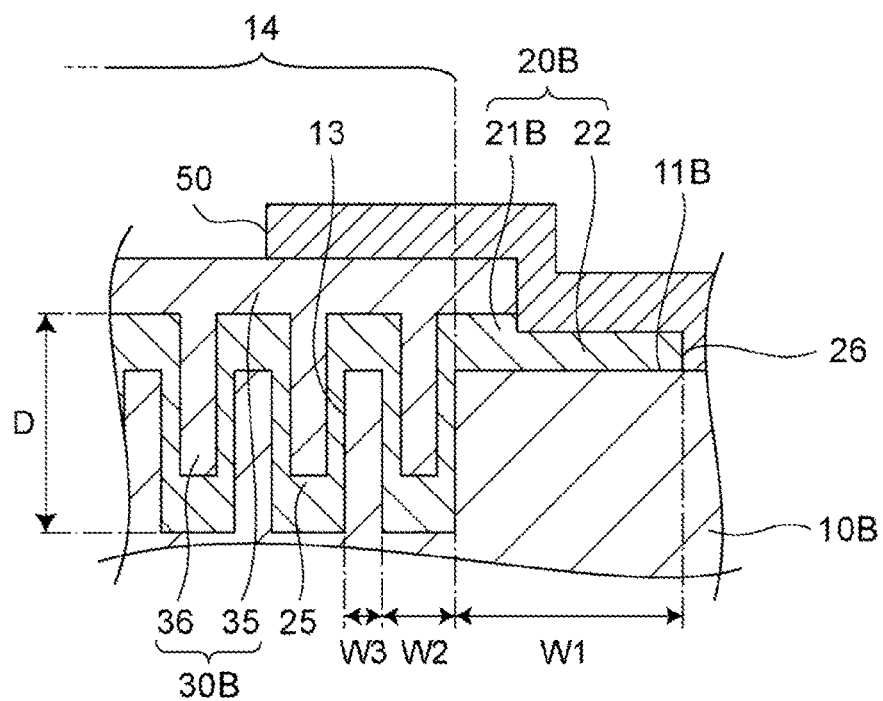
FIG. 7 is an enlarged view of a C portion in FIG. 6.

FIG. 7 is an enlarged view of a C portion in FIG. 6. As illustrated in FIG. 7, a length D of the recess portion 25 is, for example, 10 μm to 50 μm. A width W2 in the X direction of the recess portion 25 is, for example, about 5 μm. An aspect ratio of an outer shape of the recess portion 25 (a ratio of the length D in the Z direction to the width W2 in the X direction) is, for example, 2 to 10. A distance W3 in the X direction between the recess portions 25 is, for example, 3 μm. A distance W1 from the outer peripheral end 26 of the dielectric film 20B to an end portion of the trench structure 14 is, for example, 50 to 200 μm.

The density, shape, length D, and the like of the recess portion 25 can be appropriately adjusted according to the desired electric capacitance.

In addition, in the third embodiment, a thickness of the dielectric film 20B refers to a thickness in the Z direction of the dielectric film 20B covering the first main face 11B where the trench 13 is not formed.

[A Method for Manufacturing the Semiconductor Device]

A method for manufacturing the semiconductor device 1B further includes a trench forming step before the dielectric film forming step in the method for manufacturing the semiconductor device 1. That is, the method for manufacturing the semiconductor device 1B includes a trench forming step of forming the trench 13 on the first main face 11B of the semiconductor substrate 10B, a dielectric film forming step of forming the dielectric film 20B (more specifically, a precursor of the dielectric film 20B described above with reference to FIGS. 6 to 7, including the electrode layer disposing portion 21B and a portion to be the protective layer covering portion 22 later) on the first main face 11B so as to cover the inner face of the trench 13 to form the recess portion 25, a first electrode layer forming step of forming the first electrode layer 30B on the dielectric film 20B so as to form the entering portion 36 entering the recess portion 25, and removing a part of the dielectric film 20B to form the protective layer covering portion 22 (thin film region) (Thereby, the dielectric film 20B having the electrode layer disposing portion 21B and the protective layer covering portion 22 is formed.), a protective layer forming step of forming the protective layer 50 continuously covering a range from the end portion 32 of the first electrode layer 30B to the first main face 11B of the semiconductor substrate 10B, and a second electrode layer forming step of forming the second electrode layer 40 on the second main face 12 of the semiconductor substrate 10.

The method for manufacturing the semiconductor device 1B can further include a dicing step of cutting a structure body (mother integration body) having a plurality of semiconductor device structures obtained above with a dicing machine.

Specifically, an example of the method for manufacturing the semiconductor device 1B will be described with reference to FIGS. 8A to 8E. FIGS. 8A to 8E are views for explaining the method for manufacturing the semiconductor device 1B. The method for manufacturing the semiconductor device 1B includes the trench forming step, the dielectric film forming step, the first electrode layer forming step, the protective layer forming step, the second electrode layer forming step, and the dicing step. Note that the mother integration body in which the semiconductor devices 1B are integrated is manufactured from the trench forming step to the second electrode layer forming step, but for convenience of description, the manufacturing method will be described by focusing on one semiconductor device 1B.

(Trench Forming Step)

Figure 8A:
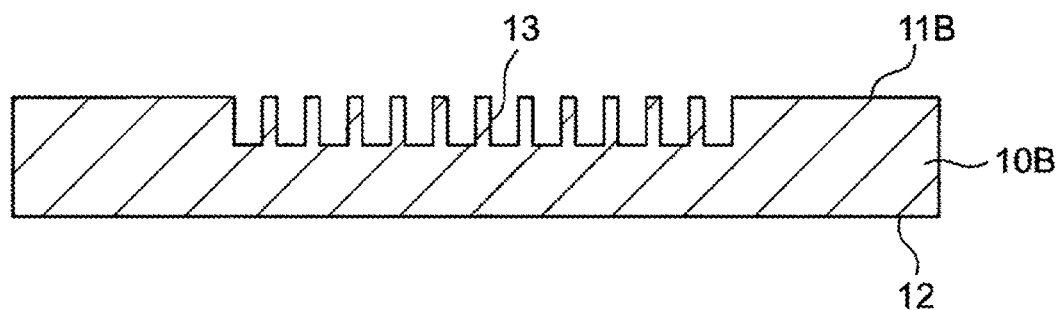
FIG. 8A is an explanatory view for explaining a method for manufacturing the semiconductor device.

In the trench forming step, as illustrated in FIG. 8A, the trench 13 is formed on the first main face 11B of the semiconductor substrate 10B. In the trench forming step, first, a silicon substrate is prepared as the semiconductor substrate 10B. Next, for example, deep etching (deep etching RIE (reactive ion etching)) is performed on the first main face 11B of the semiconductor substrate 10B by using the Bosch process such that the distance W2 between the adjacent trenches 13 becomes 3 μm and a depth of the trench 13 becomes 5 μm. Thus, a plurality of trenches 13 are formed on the first main face 11B.

A planarization step may be included after the trench forming step. In the planarization step, the first main face 11B of the semiconductor substrate 10B on which the trenches 13 are formed is planarized by using, for example, chemical mechanical polishing (CMP). Thus, the component of the semiconductor substrate 10B unnecessary for the pattern of the trenches is removed, and the semiconductor substrate 10B having a uniform thickness is provided, so that the desired layer configuration can be formed.

(Dielectric Film Forming Step)

Figure 8B:
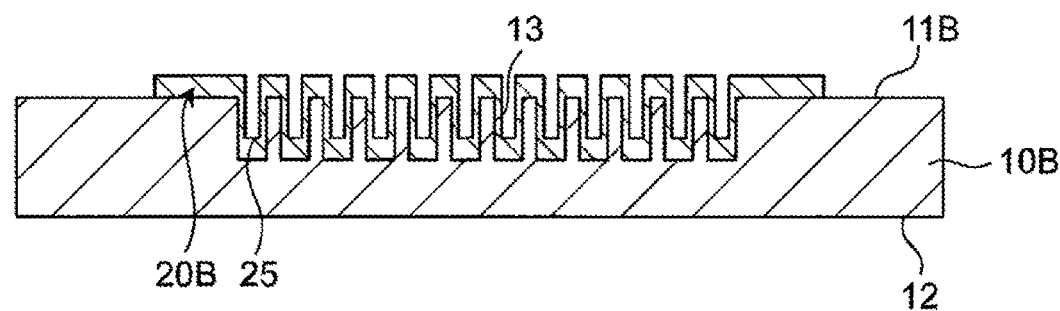
FIG. 8B is an explanatory view for explaining the method for manufacturing the semiconductor device.

In the dielectric film forming step, as illustrated in FIG. 8B, the dielectric film 20B is formed on the first main face 11B so as to cover the inner faces of the trenches 13 to form the recess portions 25. In the dielectric film forming step, for example, the dielectric film 20B is formed on the first main face 11B of the semiconductor substrate 10B, and the dielectric film 20B is patterned. For example, the dielectric film 20B of $SiO_2$ is formed on the first main face 11B of the semiconductor substrate 10B by using a chemical vapor deposition method (CVD method) so as to have a thickness of 0.1 to 3 μm. Thus, the dielectric film 20B in which inner faces of the trenches 13 are covered to form the recess portions 25 is formed.

Next, the dielectric film 20B formed on the first main face 11B of the semiconductor substrate 10B is patterned by the same method as the photolithography method or the dry etching method described in the dielectric film forming step in the method for manufacturing the semiconductor device 1. Thus, the dielectric film 20B (more specifically, a precursor of the dielectric film 20B described above with reference to FIGS. 6 to 7, including the electrode layer disposing portion 21B and a part to be the protective layer covering portion 22 later) having the predetermined pattern is formed on the first main face 11B of the semiconductor substrate 10B.

(First Electrode Layer Forming Step)

Figure 8C:
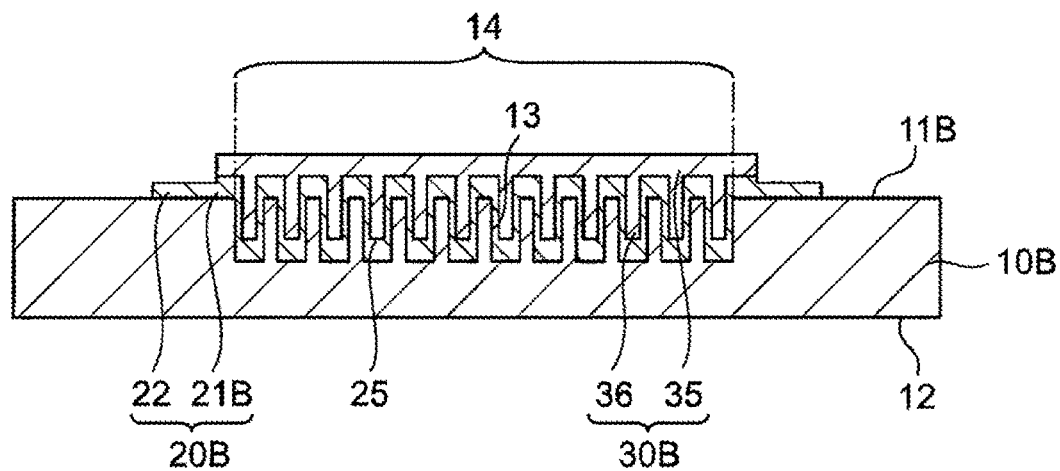
FIG. 8C is an explanatory view for explaining the method for manufacturing the semiconductor device.

In the first electrode layer forming step, as illustrated in FIG. 8C, the first electrode layer 30B is formed on the dielectric film 20B so as to form the entering portion 36 entering the recess portion 25, and a part of the dielectric film 20B is removed to form the protective layer covering portion 22 (thin film region). In the first electrode layer forming step, for example, the first electrode layer 30B is formed on the first main face 11B of the semiconductor substrate 10B on which the dielectric film 20B is disposed, and the first electrode layer 30B is patterned. Specifically, for example, the first electrode layer 30B of Al is formed on the first main face 11B of the semiconductor substrate 10B on which the dielectric film 20B is disposed by using a sputtering method or a vacuum vapor deposition method so as to have a thickness of 0.1 to 3 μm. Thus, the first electrode layer 30B having the planar portion 35 and the entering portion 36 extending in the reverse Z direction from the planar portion 35 is formed. That is, the trench structure is formed.

Next, the first electrode layer 30B is patterned by a photolithography method and a dry etching method. In the patterning of the first electrode layer 30B, a part of the protective layer covering portion 22 of the dielectric film 20B is also removed by over-etching. Thus, the first electrode layer 30B having the predetermined pattern is formed, and the protective layer covering portion 22 (thin film region) of the dielectric film 20B is formed.

(Protective Layer Forming Step to Dicing Step)

Figure 8D:
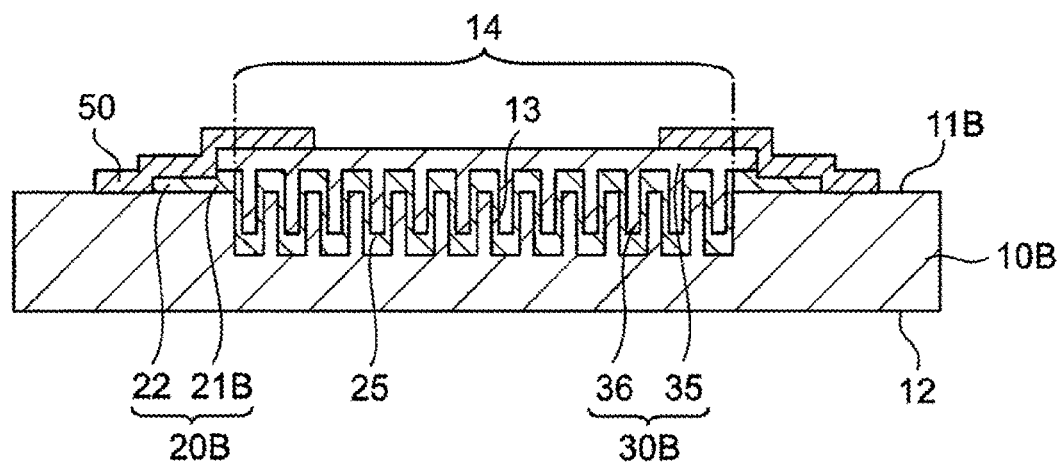
FIG. 8D is an explanatory view for explaining the method for manufacturing the semiconductor device.
Figure 8E:
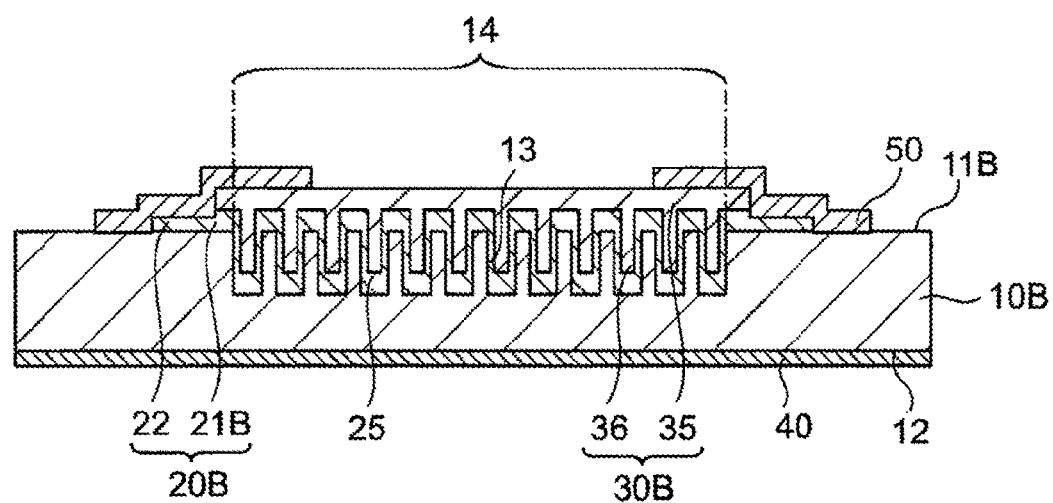
FIG. 8E is an explanatory view for explaining the method for manufacturing the semiconductor device.

As illustrated in FIGS. 8D and 8E, the semiconductor device 1B is manufactured by the protective layer forming step to the dicing step similar to the protective layer forming step to the dicing step of the first embodiment, respectively.

Fourth Embodiment (Configuration)

FIGS. 9(a) to 9(f) are partly enlarged views of sections of a semiconductor device 1C according to a fourth embodiment. The fourth embodiment is a modification of the first embodiment, and is different from the first embodiment in that thicknesses of protective layer covering portions 221 to 226 of dielectric films 201 to 206 decrease toward outer peripheral ends 261 to 266 of the dielectric films 201 to 206. This different configuration will be described below. Note that in the fourth embodiment, the same reference numerals as those in the first embodiment have the same configurations as those in the first embodiment, and thus the description thereof will be omitted.

In the fourth embodiment, six modifications will be described as representative aspects. Modifications 1 to 6 are illustrated in FIGS. 9(a) to 9(f), respectively. As illustrated in FIGS. 9(a) to 9(f), in the semiconductor device 1C (not illustrated as a whole) according to the fourth embodiment, the thicknesses of the protective layer covering portions 221 to 226 of the dielectric films 201 to 206 decrease toward the outer peripheral ends 261 to 266 of the dielectric films 201 to 206. In addition, thicknesses at the outer peripheral ends 261 to 266 of the protective layer covering portions 221 to 226 of the dielectric films 201 to 206 are smaller than the thickness at the outer peripheral end 26 of the protective layer covering portion 22 of the first embodiment.

The aspect in which the thicknesses of the protective layer covering portions 221 to 226 of the dielectric films 201 to 206 decrease from electrode layer disposing portions 211 to 216 sides toward the outer peripheral ends 261 to 266 of the protective layer covering portions 221 to 226 includes, for example, an aspect having a plurality of steps (more specifically, the aspects illustrated in FIGS. 9(a) and 9(b), and the like) or an aspect in which the step is substantially 0 (more specifically, the aspects illustrated in FIGS. 9(c) to 9(f), and the like). Modifications 1 to 6 will be specifically described with reference to FIGS. 9(a) to 9(f). Note that, in the present specification, "substantially 0" is not limited to strictly 0, and includes the case where it is difficult to clearly distinguish each step as one step in consideration of a realistic variation range.

(Modifications 1 and 2)

As illustrated in FIGS. 9(a) and 9(b), sectional shapes of the protective layer covering portions 221, 222 of the dielectric films 201, 202 are lowered stepwise from the electrode layer disposing portions 211, 212 sides of the dielectric films 201, 202 toward the outer peripheral ends 261, 262 of the protective layer covering portions 221, 222 by two and three steps, respectively.

Step portions 511, 512 of a protective layer 50C have a first upper face 53a, a first side face 54a, first step portions 561, 562, a third upper face 53c, and a third side face 54c (not illustrated). A surface shape of the protective layer 50C reflects surface shapes of the protective layer covering portions 221, 222 of the dielectric films 201, 202 below the protective layer 50C. Therefore, surface shapes of the first step portions 561, 562 correspond to the surface shapes of the protective layer covering portions 221, 222 located below the first step portions 561, 562, and are substantially the same as the surface shapes of the protective layer covering portions 221, 222. That is, the first step portions 561, 562 are lowered stepwise by two and three steps in a direction parallel to the direction from the electrode layer disposing portions 211, 212 sides toward the outer peripheral ends 261, 262 of the protective layer covering portions 221, 222, respectively. Each step of the first step portions 561, 562 is smaller than the second step of the first embodiment. Therefore, internal stress generated in the protective layer 50C is further reduced around the protective layer covering portions 221, 222 of the dielectric films 201, 202. Therefore, in the present embodiment, the occurrence of cracks in the first step portions 561, 562 can be further suppressed. Note that the protective layer covering portion of the dielectric film may be lowered stepwise by four or more steps from the electrode layer disposing portion side toward the outer peripheral end of the protective layer covering portion.

For each step, the shapes of the upper face and the side face configuring the step and the shape of the corner portion formed by the upper face and the side face are not limited to the illustrated aspect (sectional shape), and the same description as the description in the first embodiment can be applied to the present embodiment.

(Modifications 3 to 6)

In addition, as illustrated in FIGS. 9(c) to 9(f), sectional shapes of the protective layer covering portions 223 to 226 of the dielectric films 203 to 206 are continuously lowered from the electrode layer disposing portions 213 to 216 sides of the dielectric films 203 to 206 toward the outer peripheral ends 263 to 266 of the protective layer covering portions 223 to 226. In these sectional shapes, the thicknesses at the outer peripheral ends 263 to 266 of the protective layer covering portions 223 to 226 of the dielectric films 203 to 206 are substantially 0. Specifically, in FIGS. 9(c) and 9(d), the sectional shape is continuously lowered by one or more types of straight lines (more specifically, in FIG. 9(c), one straight line, and in FIG. 9(d), two straight lines having different inclinations). In FIGS. 9(e) and 9(f), the sectional shape is continuously lowered by a curve (more specifically, in FIG. 9(e), a downward convex curve, and in FIG. 9(f), an upward convex curve).

Step portions 513 to 516 include the first upper face 53a, the first side face 54a, first step portions 563 to 566, the third upper face 53c (the reference numerals 53a, 54a, and 53c are not illustrated in FIGS. 9(c) to 9(f), but are similar to FIGS. 9(a) and 9(b)), and the fourth side face 54c (not illustrated). A surface shape of the protective layer 50C reflects surface shapes of the protective layer covering portions 223 to 226 of the dielectric films 203 to 206 below the protective layer 50C. Therefore, surface shapes of the first step portions 563 to 566 correspond to the surface shapes of the protective layer covering portions 223 to 226 located below the first step portions 563 to 566, and are substantially the same as the surface shapes of the protective layer covering portions 223 to 226. That is, the first step portions 563 to 566 do not have upper faces that can be parallel to the X direction and side faces that can be parallel to the Z direction. The first step portions 563 to 566 are continuously lowered by being inclined or curved (in the sectional shapes, by one or more straight lines or curves) in a direction parallel to the direction from the electrode layer disposing portions 213 to 216 sides toward the outer peripheral ends 263 to 266 of the protective layer covering portions 223 to 226. More specifically, the first step portions 563, 564 have the sectional shapes that are continuously lowered by one and two straight lines from the electrode layer disposing portions 213, 214 sides toward the outer peripheral ends 263, 264 of the protective layer covering portions 223, 224, respectively. In addition, the first step portions 565, 566 have the sectional shapes that are continuously lowered by a downward convex curve and an upward convex curve from the electrode layer disposing portions 215, 216 sides toward the outer peripheral ends 265, 266 of the protective layer covering portions 225, 226, respectively. Therefore, internal stress generated in the protective layer 50C is further reduced around the protective layer covering portions 223 to 226 of the dielectric films 203 to 206. Therefore, in the present embodiment, in the protective layer 50C, internal stress generated in the protective layer 50C is further reduced around the protective layer covering portions 221 to 226 of the dielectric films 201 to 206. Therefore, the occurrence of cracks in the step portions 511 to 516 can be further suppressed. Therefore, in the present embodiment, the occurrence of cracks in the first step portions 561 to 566 can be further suppressed. Note that the protective layer covering portion of the dielectric film may have a sectional shape that is continuously lowered by three or more straight lines or any other curve from the electrode layer disposing portion side toward the outer peripheral end of the protective layer covering portion.

In addition, the protective layer covering portion of the dielectric film may have a sectional shape obtained by combining two or more selected from the group consisting of any appropriate stair shape, linear shape, and curved shape as long as the thickness thereof decreases from the electrode layer disposing portion side toward the outer peripheral end of the protective layer covering portion.

Note that the manufacturing conditions in the first to fourth embodiments are not limited as long as the protective layer covering portion of the dielectric film is formed such that the thickness at the outer peripheral end of the protective layer covering portion of the dielectric film in the semiconductor device is smaller than the thickness on the electrode layer disposing portion side of the dielectric film.

The present disclosure is not limited to the first to fourth embodiments, and can be implemented in various aspects as long as the purport of the present disclosure is not changed. In addition, the configurations illustrated in the first to fourth embodiments are merely examples and are not particularly limited, and various modifications can be made without substantially departing from the effects of the present disclosure. For example, the matters described in the first to fourth embodiments can be appropriately combined. For example, the configuration described in the second embodiment and the configuration described in the third embodiment can be combined.

The semiconductor device of the present invention has a capacitor structure by adding the second electrode layer, in other words, has a function as a capacitor. The semiconductor device of the present invention can be widely used for various applications, and for example, can be mounted on various electronic circuit boards as an electronic component including a capacitor by using the first electrode layer and the second electrode layer.

DESCRIPTION OF REFERENCE SYMBOLS 1, 1A, 1B, 1C: Semiconductor device
10, 10B: Semiconductor substrate
11, 11B: First main face
12: Second main face
13: Trench
20, 20B: Dielectric film
21, 21B: Electrode layer disposing portion of dielectric film
22: Protective layer covering portion of dielectric film
25: Recess portion of dielectric film
26: Outer peripheral end of dielectric film
30, 30A, 30B: First electrode layer
31: Center portion of first electrode layer
32, 32A: End portion of first electrode layer
33, 33A: Outer peripheral end (end face) of first electrode layer
36: Entering portion
50, 50A: Protective layer
51, 51A: Step portion
321: First end portion of first electrode layer
323: Second end portion of first electrode layer
Ta: Thickness of electrode layer disposing portion of dielectric film
Tb: Thickness at outer peripheral end of protective layer covering portion of dielectric film

The invention claimed is:

1. A semiconductor device comprising:
a semiconductor substrate having a first main face and a second main face opposite each other;
a dielectric film on a part of the first main face, the dielectric film having an electrode layer disposing portion and a protective layer covering portion, a thickness of the protective layer covering portion in an outer peripheral end of the dielectric film is smaller than a thickness of the electrode layer disposing portion of the dielectric film, and the protective layer covering portion has the outer peripheral end;
a first electrode layer on the electrode layer disposing portion of the dielectric film; and
a protective layer that continuously covers a range including an end portion of the first electrode layer, the outer peripheral end of the dielectric film, and at least a part of the first main surface of the semiconductor substrate, and wherein the protective layer has a corner corresponding to the outer peripheral end,
wherein the end portion of the first electrode layer has a first end portion having an outer peripheral end and a second end portion adjacent to the first end portion and extending toward a center of the first electrode layer,
a thickness at the outer peripheral end of the first end portion is smaller than a thickness of the second end portion, and
a surface roughness of an upper face of the first end portion is greater than a surface roughness of an upper face of the second end portion.

2. The semiconductor device according to claim 1, wherein a minimum thickness of the electrode layer disposing portion is larger than a maximum thickness of the protective layer covering portion.

3. The semiconductor device according to claim 1, wherein a thickness of the protective layer is equal to or larger than the thickness of the electrode layer disposing portion of the dielectric film.

4. The semiconductor device according to claim 1, wherein the protective layer includes a step portion having a first step between a first upper face and a second upper face of the protective layer, a second step between the second upper face and a third upper face of the protective layer, a third step between the third upper face and a fourth upper face of the protective layer, and a fourth step between the fourth upper face and the first main face of the semiconductor substrate, and the first step, the second step, the third step and the fourth step are sequentially lower from the first upper face to the fourth upper face.

5. The semiconductor device according to claim 1, wherein the thickness of the protective layer is 0.1 μm to 3 μm.

6. The semiconductor device according to claim 1, wherein the first electrode layer is made of polysilicon or Al.

7. The semiconductor device according to claim 1, wherein the protective layer is made of silicon nitride.

8. The semiconductor device according to claim 1, wherein the dielectric film is made of silicon oxide.

9. The semiconductor device according to claim 1, further comprising a second electrode layer on the second main face of the semiconductor substrate.

10. The semiconductor device according to claim 1, wherein the thickness of the electrode layer disposing portion of the dielectric film is 0.1 μm to 3 μm.

11. The semiconductor device according to claim 1, wherein a width of the protective layer covering portion of the dielectric film is 0.1 μm to 30 μm.

12. The semiconductor device according to claim 1, wherein the protective layer includes a step portion having a first step between a first upper face and a second upper face of the protective layer, a second step between the second upper face and a third upper face of the protective layer, and a third step between the third upper face and the first main face of the semiconductor substrate, and the first step, the second step and the third step are sequentially lower from the first upper face to the third upper face.

13. The semiconductor device according to claim 1, wherein the thickness of the protective layer covering portion of the dielectric film decreases toward the outer peripheral end of the dielectric film.

14. The semiconductor device according to claim 13, wherein the thickness of the protective layer covering portion of the dielectric film decreases stepwise toward the outer peripheral end of the dielectric film.

15. The semiconductor device according to claim 13, wherein the thickness of the protective layer covering portion of the dielectric film continuously decreases along one or more straight lines toward the outer peripheral end of the dielectric film.

16. The semiconductor device according to claim 13, wherein the thickness of the protective layer covering portion of the dielectric film continuously decreases along a curved line toward the outer peripheral end of the dielectric film.

17. The semiconductor device according to claim 1, wherein a length in a width direction of the protective layer covering portion is larger than the thickness of the protective layer covering portion.

18. The semiconductor device according to claim 1, wherein the first end portion and the second end portion are made of a same conductive material.

19. A semiconductor device according to claim 1 comprising:
   a semiconductor substrate having a first main face and a second main face opposite each other;
   a dielectric film on a part of the first main face, the dielectric film having an electrode layer disposing portion and a protective layer covering portion, a thickness of the protective layer covering portion in an outer peripheral end of the dielectric film is smaller than a thickness of the electrode layer disposing portion of the dielectric film, and the protective layer covering portion has the outer peripheral end;
   a first electrode layer on the electrode layer disposing portion of the dielectric film; and
   a protective layer that continuously covers a range including an end portion of the first electrode layer, the outer peripheral end of the dielectric film, and at least a part of the first main surface of the semiconductor substrate, and wherein the protective layer has a corner corresponding to the outer peripheral end, wherein
   the semiconductor substrate has a trench on the first main face thereof,
   the electrode layer disposing portion of the dielectric film is continuously disposed on the first main face so as to cover an inner face of the trench to form a recess portion, and
   the first electrode layer has an entering portion entering the recess portion.

* * * * *